US012568716B2

(12) United States Patent
Kub et al.

(10) Patent No.: US 12,568,716 B2
(45) Date of Patent: Mar. 3, 2026

(54) WAFER-SCALE SEPARATION AND TRANSFER OF GaN MATERIAL

(71) Applicant: The Government of the United States of America, as represented by the Secretary of the Navy, Arlington, VA (US)

(72) Inventors: Francis J. Kub, Arnold, MD (US); Andrew D. Koehler, Alexandria, VA (US); Travis J. Anderson, Alexandria, VA (US); Karl D. Hobart, Alexandria, VA (US); Marko J. Tadjer, Vienna, VA (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 0 days.

(21) Appl. No.: 18/913,184

(22) Filed: Oct. 11, 2024

(65) Prior Publication Data

US 2025/0126931 A1 Apr. 17, 2025

Related U.S. Application Data

(60) Provisional application No. 63/590,164, filed on Oct. 13, 2023.

(51) Int. Cl.
*H10H 20/01* (2025.01)
(52) U.S. Cl.
CPC ........ *H10H 20/0137* (2025.01); *H10H 20/01* (2025.01); *H10H 20/018* (2025.01)
(58) Field of Classification Search
CPC ... H10H 20/01; H10H 20/0137; H10H 20/018
See application file for complete search history.

(56) References Cited

U.S. PATENT DOCUMENTS 6,328,796 B1 12/2001 Kub et al.
9,653,642 B1* 5/2017 Raring ................ H10D 84/204
(Continued)

FOREIGN PATENT DOCUMENTS

KR 10-2017-0044638 5/2017

OTHER PUBLICATIONS

Unknown, MEMS Resonator Based on Gallium Nitride Maintains Stability at High Temperature, Business, Jan. 2021, Photonics Spectra, Photonics.com.

(Continued)

*Primary Examiner* — Matthew C Landau
*Assistant Examiner* — Dmitriy Yemelyanov
(74) *Attorney, Agent, or Firm* — US Naval Research Laboratory; Jorie L. Stroup

(57) ABSTRACT

A wafer-scale method of making gallium nitride (GaN) device die is provided. In embodiments, the method includes: providing a GaN wafer including a GaN material layer, a non-crystalline substrate, and at least one etchable intermediate layer between the GaN material layer and the non-crystalline substrate; forming trenches through the GaN material layer and at least partially through the at least one etchable intermediate layer; forming one or more tether material layers on a first side of the GaN material layer and through portions of the trenches, thereby forming a set of tethers between the GaN material layer and the non-crystalline substrate; and removing the at least one etchable intermediate layer to expose a second side of the GaN material layer. In implementations, the resulting exposed second side of the GaN material layer has a surface roughness of less than 1 nanometers (nm) Root Mean Square (RMS).

19 Claims, 16 Drawing Sheets

(56)                    References Cited

U.S. PATENT DOCUMENTS

| | | |
|---|---|---|
| 9,761,754 B2 | 9/2017 | Bower et al. |
| 9,991,413 B2 | 6/2018 | Bower et al. |
| 10,458,038 B2 | 10/2019 | Zhang et al. |
| 2010/0289124 A1 | 11/2010 | Nuzzo et al. |
| 2010/0317132 A1 | 12/2010 | Rogers et al. |
| 2014/0141571 A1 | 5/2014 | Hussain et al. |
| 2015/0035173 A1* | 2/2015 | Dang ................. G01R 31/2607 |
| | | 524/375 |
| 2015/0132873 A1* | 5/2015 | Rogers ................... H01L 24/95 |
| | | 264/21 |
| 2016/0027961 A1* | 1/2016 | Mi ....................... H10H 20/818 |
| | | 257/13 |
| 2018/0138357 A1 | 5/2018 | Henley |
| 2019/0088495 A1 | 3/2019 | Youtsey et al. |
| 2021/0020491 A1 | 1/2021 | Trindade et al. |

OTHER PUBLICATIONS

Zheng Gong, Layer-Scale and Chip-scale transfer techniques for Functional Devices and Systems: A Review, Nanomaterials 2021, 11, 842. https://doi.org/10.3390/nano11040842.
Korean intellectual Property Office, Written Opinion Of the International Searching Authority, PCT/US2024/050971, completed Jan. 24, 2025.

* cited by examiner

FIG. 4A CONTINUED

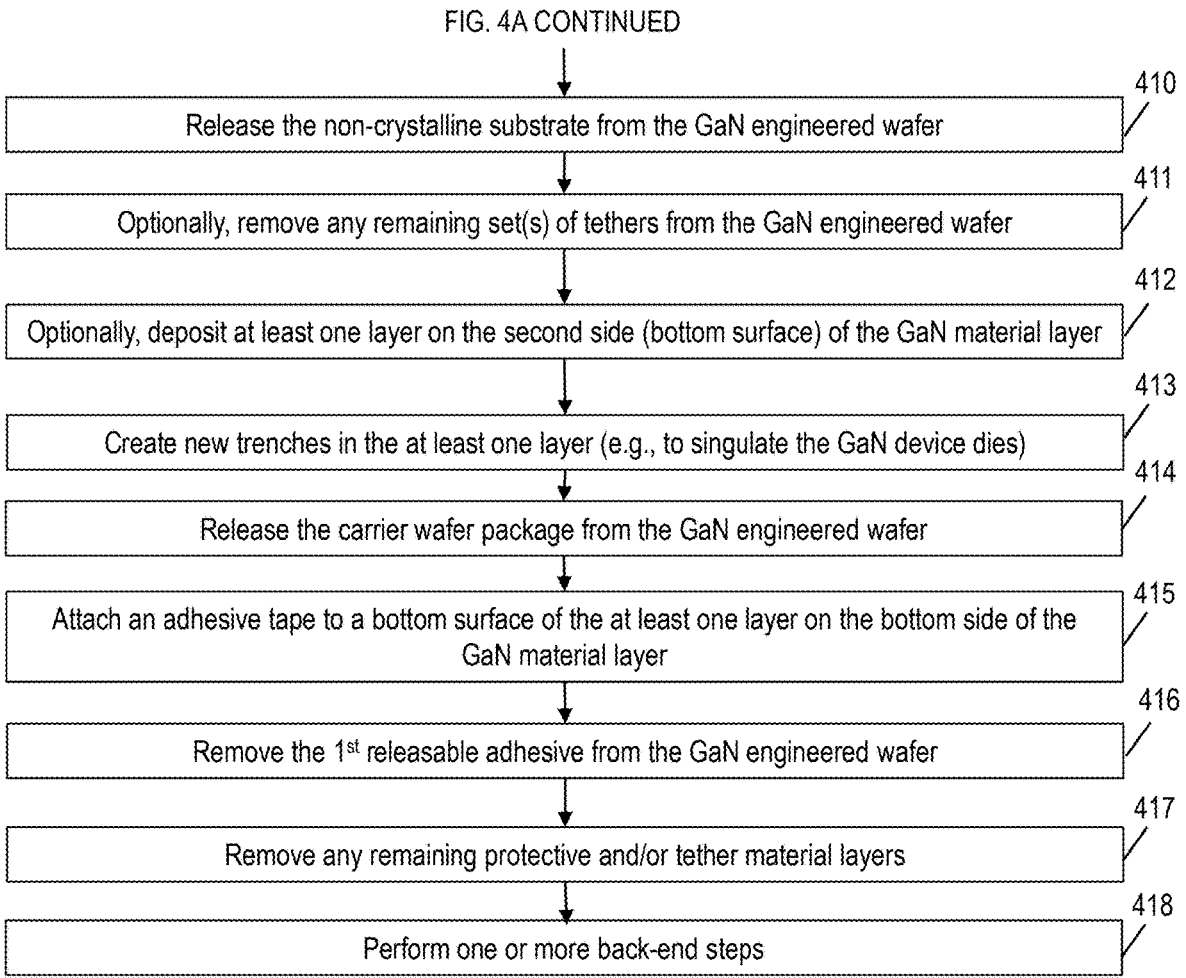

410   Release the non-crystalline substrate from the GaN engineered wafer

411   Optionally, remove any remaining set(s) of tethers from the GaN engineered wafer 412   Optionally, deposit at least one layer on the second side (bottom surface) of the GaN material layer 413   Create new trenches in the at least one layer (e.g., to singulate the GaN device dies)

414   Release the carrier wafer package from the GaN engineered wafer

415   Attach an adhesive tape to a bottom surface of the at least one layer on the bottom side of the GaN material layer 416   Remove the 1st releasable adhesive from the GaN engineered wafer 417   Remove any remaining protective and/or tether material layers 418   Perform one or more back-end steps

534A (Ohmic Metal Source)

532A (Optional N+)   538 (AlGaN)

536 (Gate Metal)

534B (Ohmic Metal Drain)

532B (Optional N+)

530 (N-type GaN)

526B (Copper)

504A

502

-504-
(GaN)

504B 524 (Optional Metal)

526A (Copper)

528 (Solderable or Passivation Metal)

600

634A (Ohmic Metal Source)

638 (AlGaN)

636 (Gate Metal)

634B (Ohmic Metal Drain)

632 (Optional N+)

604A

602

-604-
(GaN)

604B 624 (Optional Metal)

626A (Copper)

628 (Solderable or Passivation Metal)

WAFER-SCALE SEPARATION AND TRANSFER OF GaN MATERIAL

CROSS-REFERENCE TO RELATED APPLICATIONS

This Application is a Nonprovisional of, and claims the benefit of priority under 35 U.S.C. § 119 based on, U.S. Provisional Patent Application No. 63/590,164 filed Oct. 13, 2023. The Provisional Application and all references cited herein are hereby incorporated by reference into the present disclosure in their entirety.

FEDERALLY SPONSORED RESEARCH AND DEVELOPMENT

The United States Government has ownership rights in this invention. Licensing inquiries may be directed to Office of Technology Transfer, US Naval Research Laboratory, Code 1004, Washington, D.C. 20375, USA; +1.202.767.7230; nrltechtran@us.navy.mil, referencing Navy Case No. 211813-US2.

BACKGROUND OF THE INVENTION

Aspects of the present invention relate generally to semiconductor manufacturing and, more particularly, to the wafer-scale separation and transfer of a gallium nitride (GaN) material.

In general, semiconductors undergo a design process, a front-end process, and a back-end process. The front-end process creates wafer-scale devices according to the design, which can be converted into individual products using back-end processes, such as cutting the wafer along kerf lines to singulate individual die. In general, a singulated die refers to an individual semiconductor chip that has been separated or singulated from a larger wafer. A die, in the context of integrated circuits, is a small block of semiconducting material on which a given functional circuit is fabricated. Pick-and-place machines are often used to automatically pick up and place surface-mount devices (SMDs) on die onto a printed circuit board. Micro-transfer printing may also be used for transferring a device (on a die) to a target circuit, either as an individual die or chip or as a full wafer of die.

Wafer back grinding or wafer thinning is a semiconductor manufacturing process for controlling wafer thickness. In general, wafer material is ground down to remove a desired amount of material in order to produce ultra-thin wafers of semiconductor material. Wafer thinning may require highly advanced machines and special environments for semiconductor wafers to be thinned, then diced into small chips for use in semiconductor devices. Disadvantages of wafer thinning include mechanical stress, which may cause stress-induced defects in the material to be thinned, and scratches produced on the material by the grinding process.

SUMMARY OF THE INVENTION

In a first aspect of the invention, there is a wafer-scale method of making a gallium nitride (GaN) device die including: providing a GaN wafer including a GaN material layer, a non-crystalline substrate, and at least one etchable intermediate layer between the GaN material layer and the non-crystalline substrate; forming trenches through the GaN material layer and at least partially through the at least one etchable intermediate layer; forming one or more tether material layers on a first side of the GaN material layer and through portions of the trenches, thereby forming a set of tethers between the GaN material layer and the non-crystalline substrate; and removing the at least one etchable intermediate layer to expose a second side of the GaN material layer.

In implementations, the method further includes depositing at least one additional layer (e.g., a metal layer) directly on the second side of the GaN material layer. In aspects of the invention, the at least one additional layer is directly deposited on the second side of the GaN material layer without any physical grinding of the GaN material layer. In embodiments, the at least one etchable intermediate layer comprises a nucleation layer, a silicon material layer, and an etchable material layer. In implementations, the nucleation layer and the silicon material layer are removed via etching.

In some embodiments, the etchable material layer is a hydrofluoric acid etchable material layer, the tether material layer is resistant to hydrofluoric acid, and removing the hydrofluoric acid etchable material layer comprises etching with hydrofluoric acid. In other embodiments, the etchable material layer is an anhydrous hydrofluoric vapor etchable material, the tether material layer is resistant to anhydrous hydrofluoric vapor, and removing the anhydrous hydrofluoric acid etchable material layer comprises etching with anhydrous hydrofluoric vapor. In some embodiments, at least a portion of the one or more tether material layers is/are removed via etching. In implementations, the method further includes depositing a protective layer over at least a portion of a top of the GaN wafer, wherein the protective layer protects against hydrofluoric acid etching, hydrofluoric acid plus oleum etching, or anhydrous hydrofluoric vapor etching.

The method may also include chemical mechanical polishing of the second side of the GaN material layer, resulting in the second side of the GaN material layer having a surface roughness of less than 1 nanometers (nm) Root Mean Square (RMS). In embodiments, the GaN material layer includes multiple device elements. In aspects of the invention, the one or more tether material layers comprises a first tether material layer defining a first set of tethers between the GaN material layer and the non-crystalline substrate and a photoresist layer forming a second set of tethers between the GaN material layer and the non-crystalline substrate.

The method may further include attaching, by a releasable adhesive material, a wafer-scale carrier wafer package to the GaN wafer. In embodiments, the releasable adhesive material is selected from the group consisting of: a heat-releasable adhesive, an ultra-violet releasable adhesive, a laser releasable adhesive, an organic releasable adhesive, an inorganic releasable adhesive, and combinations thereof. In implementations, the carrier wafer package further includes a carrier wafer and a second releasable adhesive material, wherein the releasable adhesive material attaches the carrier wafer to the GaN wafer through the second releasable adhesive material. The carrier wafer package may further include a laser release layer between the carrier wafer and the second releasable adhesive material, wherein the carrier wafer is transparent to laser light.

In embodiments, the method further includes breaking or removing a portion of the set of tethers from the GaN wafer too separate the non-crystalline substrate from the GaN material layer. The method may also include attaching an adhesive tape to a bottom side of GaN wafer; and removing the carrier wafer package from the GaN material layer. In aspects of the invention, the method includes singulating the GaN device die from the GaN wafer, and optionally transferring the GaN device die using a wafer-scale transfer method or a sequential wafer-scale transfer method.

BRIEF DESCRIPTION OF THE DRAWINGS

Aspects of the present invention are described in the detailed description which follows, in reference to the noted plurality of drawings by way of non-limiting examples of exemplary embodiments of the present invention.

FIGS. 4A-4B show a flowchart of an exemplary method in accordance with aspects of the present invention in accordance with embodiments of the invention.

DETAILED DESCRIPTION

Aspects of the present invention relate generally to semiconductor manufacturing and, more particularly, to the wafer-scale separation and transfer of a gallium nitride (GaN) material, and resulting semiconductor devices. In embodiments, a method is provided to release and transfer GaN device die from a GaN engineered wafer using wafer scale processing for release, and optionally using wafer scale processing for transfer of the GaN device die to a tape (with adhesive), a support wafer (with temporary bonding material), or a combination of tape (with adhesive) and temporary bonding adhesive material that adhere a carrier wafer to the GaN engineered wafer. The GaN device die can comprise a device formed in III-nitride material or material layers. The GaN device die can comprise an epitaxial III-nitride material and material layers.

The wafer-scale transfer discussed herein is the transfer of all or almost all of the GaN device die on a wafer. Sequential wafer-scale transfer as discussed herein is: the sequential transfer of a single GaN device die until all or almost all of the GaN device die are transferred, or the sequential collective transfer of multiple GaN device die until all or almost all of the GaN device die are transferred. The transfer of a single GaN device die can be performed using print transfer technology, die-to-wafer, or die-to-die technology. The transfer of a multiple GaN device die can be performed using collective print transfer technology or collective die-to-wafer transfer technology.

Implementations of the invention result in semiconductor devices including at least one thin GaN material layer, without the need for wafer thinning (e.g., grinding) processes. The GaN material layer may be made partially or entirely insulating by doping the GaN material with carbon or iron dopants. Advantageously, GaN device die embodiments include a non-ground GaN material layer, thereby avoiding damage (e.g., scratches) and stress generated by the use of conventional wafer back grinding or wafer thinning processes. In implementations, GaN device die are produced including a GaN material layer having an ultra-smooth surface with a surface roughness of less than 1.0 root mean square (RMS), or less than 0.5 nm RMS. Embodiments of the invention result in GaN device die including a GaN layer with high thermal conductivity and without a GaN/SiC (silicon carbide) interface. Such device die are free from the thermal boundary resistance caused by the presence of a GaN/SiC interface.

Figure 1A:
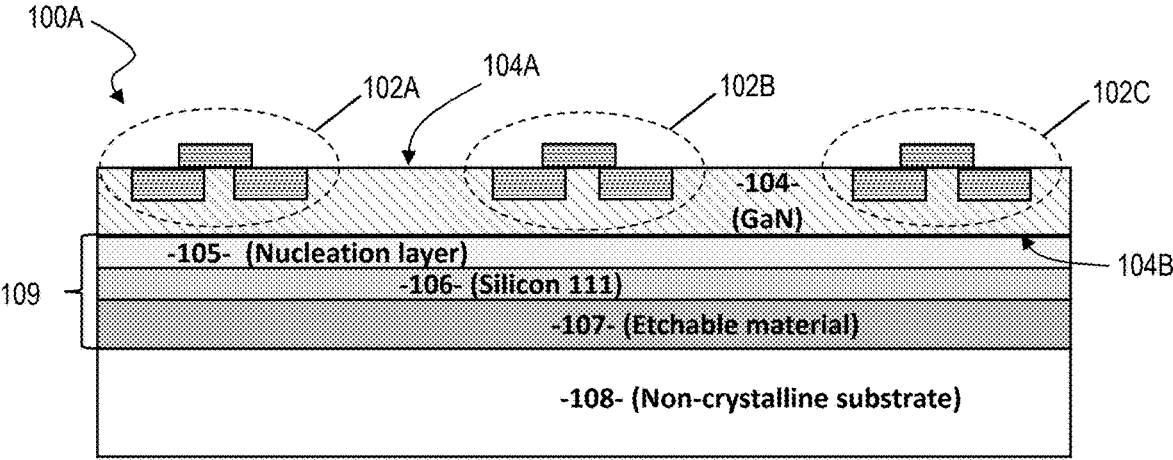
FIG. 1A is a cross-sectional side view of a gallium nitride (GaN) engineered wafer in an initial stage accordance with embodiments of the invention in accordance with embodiments of the invention.

FIG. 1A is a cross-sectional side view of a GaN engineered wafer 100A at an initial stage in accordance with embodiments of the invention. The GaN engineered wafer 100A is an example of a starting wafer that may be used to manufacture GaN devices die in accordance with this disclosure. The GaN engineered wafer 100A of FIG. 1A depicts multiple exemplary device elements 102A, 102B and 102C. Examples of devices elements that may be utilized in accordance with embodiments of the invention include: lateral III-nitride power switching devices, vertical III-nitride power switching devices, III-nitride radio frequency (RF) devices, III-nitride light emitting diodes, III-nitride micro light emitting diodes, III-nitride vertical emitting lasers, III-nitride lateral emitting laser, III-nitride imaging array, III-nitride photovoltaic diodes, III-nitride devices on a flexible substrate, III-nitride devices on a flexible polymer substrate, thin non-grind damaged III-nitride material transferred to a non-flexible substrate or a flexible substrate, and thin III-nitride material for bulk acoustic wave filters direct fusion bonded on a solid acoustic reflector. The above exemplary device elements are shown for exemplary purposes only, and one of ordinary skill in the art would understand that different types of device elements may be incorporated into or onto a GaN engineered wafer 100A in accordance with embodiments of the invention. Alternatively, the GaN engineered wafer 100A could be free from any device elements.

The exemplary GaN engineered wafer 100A of FIG. 1 includes a GaN material layer 104 having a first (top) surface 104A in contact with the device elements 102A, 102B and 102C, a non-crystalline substrate 108, and a plurality of intermediate layers 109 between the GaN material layer 104 and the non-crystalline substrate 108. In the example of FIG. 1A, the intermediate layers 109 include: a nucleation layer 105 in contact with a second (bottom) layer 104B of the GaN material layer 104, a silicon (Si) layer 106 (e.g., Si 111), and an etchable material layer 107. In implementations, the nucleation layer 105 comprises aluminum nitride (AlN). In embodiments, the etchable material layer 107 comprises a hydrofluoric acid (HF)-etchable material layer. In implementations, the GaN material layer 104 is grown as an epitaxial layer on an AlN nucleation layer 105. The GaN engineered wafer 100A with the GaN material layer 104 and non-crystalline substrate 108 has the following attractive features: large diameter non-crystalline substrates 108 are commercially available, the GaN material layer 104 has low defect density, and thick GaN material layers (e.g., 104) can be epitaxially grown on the non-crystalline substrate 108 without cracking.

In embodiments, the GaN material layer 104 comprises an epitaxial material with a C-axis orientation (001) or a C-axis (000-1) orientation. In implementations, the GaN epitaxial material comprises gallium face C-axis material or a nitrogen face C-axis material. In aspects of the invention, the GaN material layer 104 has a thermal conductivity of more than 170 Watts per meter-Kelvin (W/mK). In one example, the GaN material layer 104 has a thermal conductivity of 230 W/mK. In implementations, the GaN epitaxial material has a threading edge dislocation (TED) density of: less than $1\times10^8$ dislocations/cm$^2$; less than $1\times10^7$ dislocations/cm$^2$; or less than $5\times10^6$ dislocations/cm$^2$. The GaN epitaxial material may be free of cracks. In embodiments, the GaN material layer 104 is partially or entirely made insulating by doping the GaN material with carbon or iron dopants. In implementations, the GaN material layer 104 has a thickness in the range of 300 nm to 50 microns. In some embodiments, the GaN material layer 104 has an in-plane biaxial tensile stress of: less than 1.5 Gigapascals (GPa); less than 1.0 GPa; or less than 0.7 GPa.

In implementations, the silicon layer 106 is Si (111). In embodiments, the etchable material layer 107 comprises silicon oxide or a metal. In aspects of the invention, the non-crystalline substrate layer 108 comprises aluminum nitride or silicon carbide.

Figure 1B:
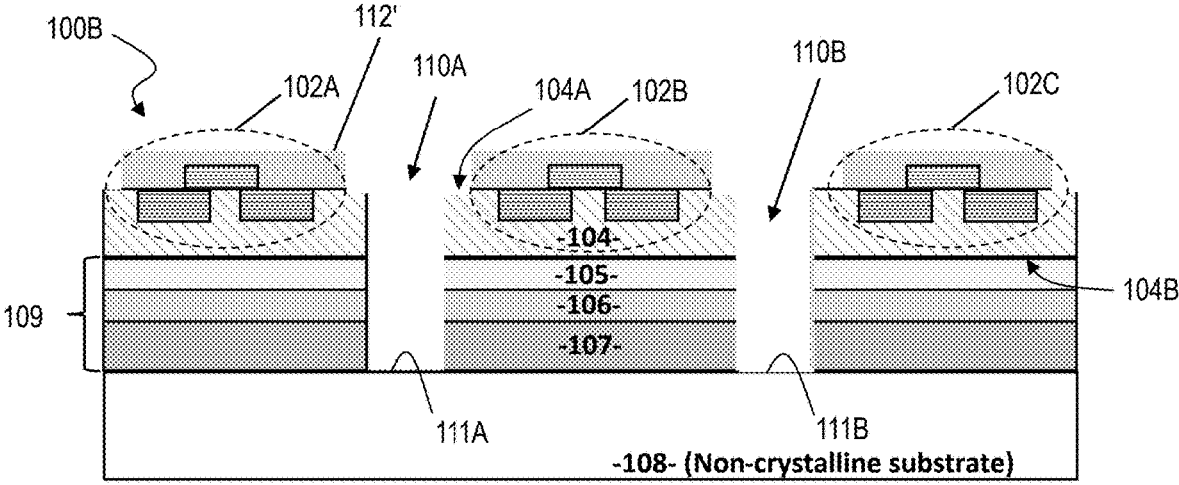
FIG. 1B is a cross-sectional side view of a stage of the GaN engineered wafer of FIG. 1A, with an added protective layer and trenches formed therein in accordance with embodiments of the invention.

FIG. 1B is a cross-sectional side view of a stage 100B of the GaN engineered wafer of FIG. 1A, with an added protective layer 112', and trenches 110A, 110B formed therein in accordance with embodiments of the invention. In some embodiments, like the one shown, a protective layer 112' is applied over the device elements 102A, 102B and 102C of the GaN engineered wafer 100B. In implementations, the trenches 110A, 110B are formed via etching, sawing, or laser cutting the protective layer 112' (when present), the GaN material layer 104, and the intermediate layers 109 (i.e., nucleation layer 105, silicon layer 106, and etchable material layer 107), thereby exposing top surface portions 111A, 111B of the non-crystalline substrate 108.

Figure 1C:
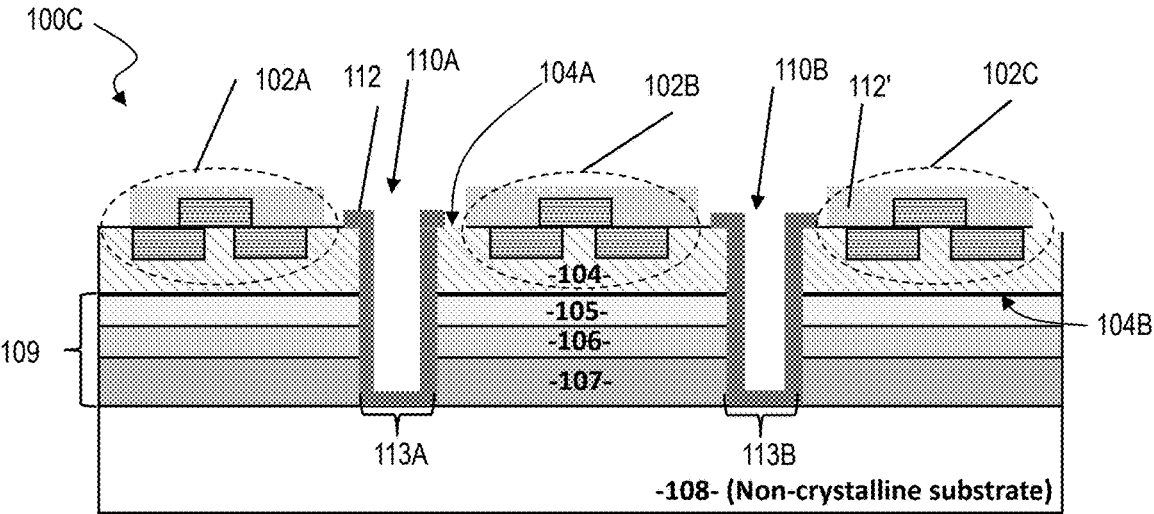
FIG. 1C is a cross-sectional side view of a stage of the GaN engineered wafer of FIG. 1A, with a tether material layer in accordance with embodiments of the invention.

FIG. 1C is a cross-sectional side view of a stage 100C of the GaN engineered wafer of FIG. 1A, with a tether material layer 112 added in accordance with embodiments of the invention. In implementations, the tether material layer 112 is formed via photolithography and comprises an HF-resistant material such as photoresist or aluminum. In embodiments, the tether material layer 112 comprises aluminum. The tether material layer 112 may comprise a protective layer, in which case there is no need for the optional protective layer 112', and the tether material layer 112 is extended over the device elements 102A, 102B and 102C to act as both a protective layer and a tether. See, for example, the embodiment in FIG. 2A. As depicted in FIG. 1C, the tether material layer 112 is formed over: at least a portion of the GaN engineered wafer, walls of the trenches 110A, 110B, and the top surface portions 111A, 111B of the non-crystalline substrate 108.

In implementations, the tether material layer 112 comprises two main parts; a foot (including 113A, 113B) and a connection to the GaN engineered wafer and/or GaN material layer 104B. In embodiments, the foot is large enough to provide adhesion to the non-crystalline substrate 108 such that the foot does not peel off of the non-crystalline substrate 108 during pickup of the GaN engineered wafer by the tether material layer 112. Engineering of strong adhesion along the narrowing tethers 113A, 113B allows the tethers 113A, 113B to break in a desired location as part of the manufacturing process, which is usually as close as possible to the connection to the GaN device die, as this prevents flaps and debris which act as defects and may affect the yield of a manufactured device.

Figure 1D:
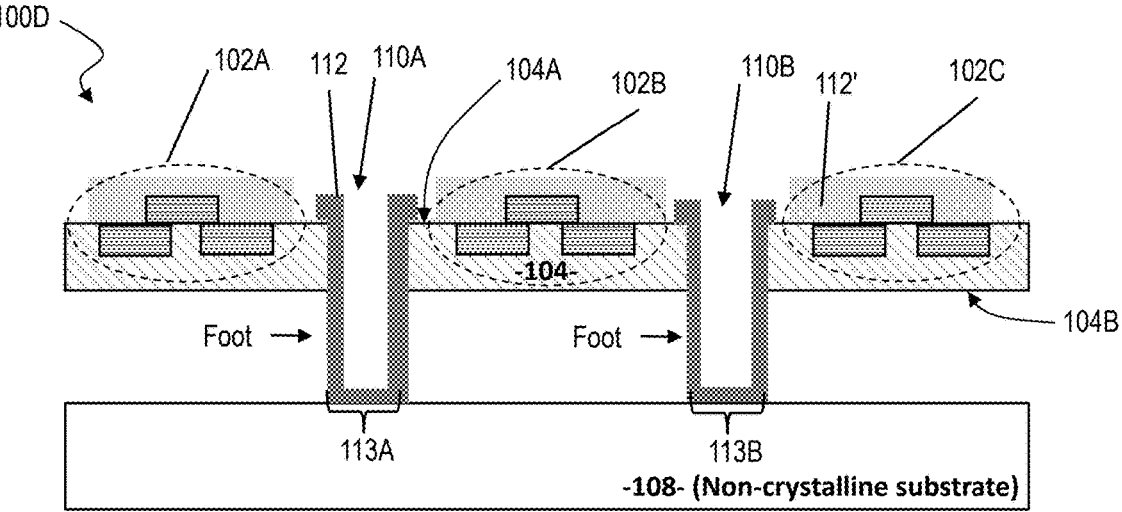
FIG. 1D is a cross-sectional side view of a stage of the GaN engineered wafer of FIG. 1A, with layers removed to expose a set of tethers and a bottom side of the GaN material in accordance with embodiments of the invention.

FIG. 1D is a cross-sectional side view of a stage 100D of the GaN engineered wafer of FIG. 1A, with the intermediate layers 109 removed to expose a set of tethers 113A, 113B and the bottom side 104A of the GaN material layer 104 in accordance with embodiments of the invention. In implementations, HF is applied to the GaN engineered wafer 100D to exposed portions of an HF-etchable material layer 107 to laterally undercut-etch the HF etchable material layer 107. In implementations, the HF is in the form of 5% HF when using a photoresist tether material layer 112, anhydrous HF vapor when utilizing an aluminum or aluminum alloy tether material layer 112, or liquid HF plus oleum (e.g., 48% HF) when using an aluminum tether material layer 112. In embodiments, the silicon layer 106 is then removed via etching (e.g., using xenon fluoride vapor). In aspects of the invention, the AlN nucleation layer 105 is then removed via etching (e.g., using AZ® 400K developer or potassium hydroxide (KOH)). This results in a smooth exposed bottom surface (second surface) 104B of the GaN material layer 104.

Figure 1E:
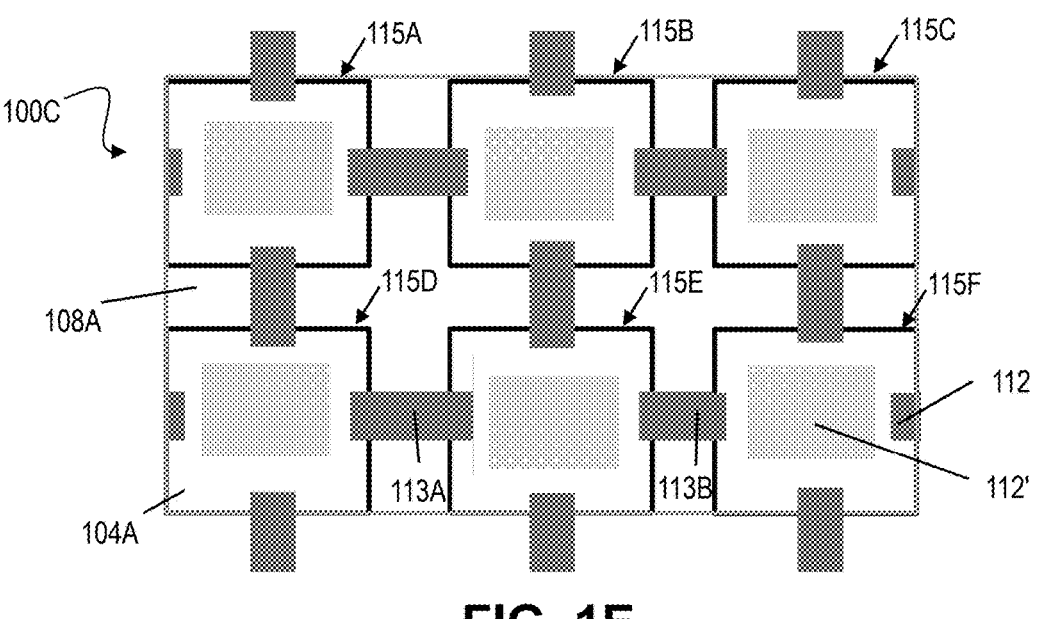
FIG. 1E is a top view of the GaN engineered wafer of FIG. 1D, depicting individual die portions interconnected by the tether material layer in accordance with embodiments of the invention.

FIG. 1E is a top view of the GaN engineered wafer at the stage 100C of FIG. 1D, depicting individual die portions 115A-115F interconnected by the tether material layer 112 in accordance with embodiments of the invention. The protective layer 112' protects the device elements 102A, 102B and 102C (not shown). The protective layer 112 can optionally comprise a stressor material layer such as a nickel layer to cause the GaN material layer to curve upward during the lateral undercut etch of the etchable material layer to facilitate the diffusion of etchant into the region between the GaN material and the non-crystalline substrate. It can be seen that edges of each individual die portion 115A-115F are exposed during the etching steps described above, enabling lateral undercut etching of layer 107 followed by etching of layers 106 and 105 (depicted in FIGS. 1A-1C), while maintaining a tethered connection between a top surface of the GaN material layer 104A and a top surface of the non-crystalline substrate 108A. The protective material layer 112' can optionally be removed by plasma or wet chemical etch after the lateral undercut etch is performed.

Figure 1F:
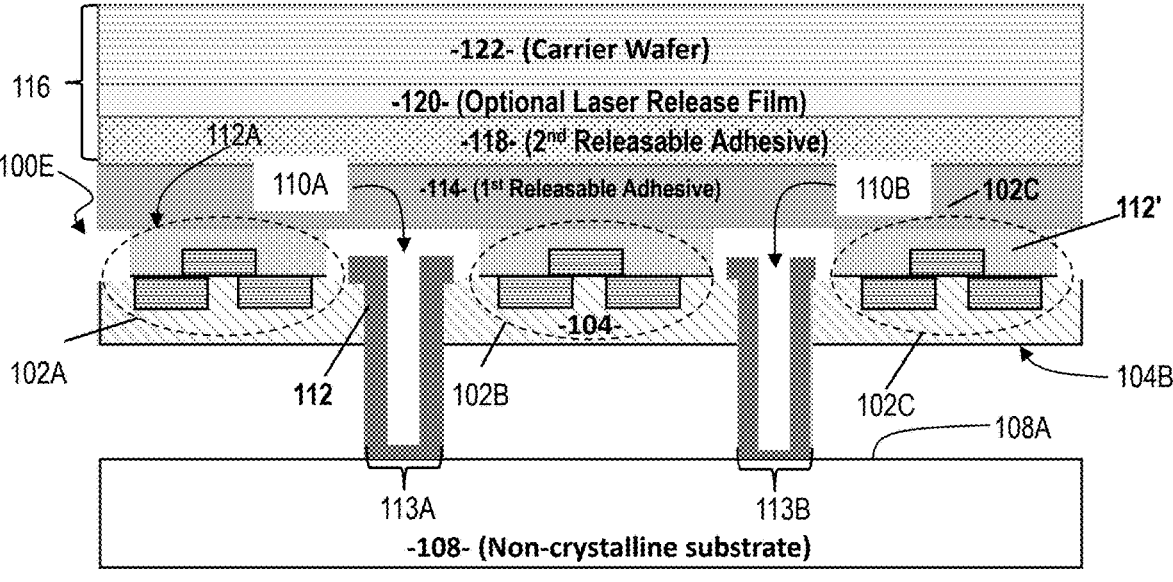
FIG. 1F is a cross-sectional side view of a stage of the GaN engineered wafer of FIG. 1A, with a carrier wafer package attached thereto by releasable adhesive in accordance with embodiments of the invention.

FIG. 1F is a cross-sectional side view of a stage 100E of the GaN engineered wafer of FIG. 1A, with a carrier wafer package 116 attached thereto. In embodiments, the carrier wafer package 116 is attached to the GaN engineered wafer by a second releasable adhesive material 118, which may be in the form of an organic adhesive, an inorganic adhesive, or a tape, for example. In implementations, a first releasable adhesive material 114 (e.g., a tape or polymer) is adhered to a top surface 112A of the GaN device die (comprising a protective material layer 112', as well as the tether material layer 112), and a carrier wafer 122 is bonded (optionally under vacuum) to the first releasable adhesive material 114 via the second releasable adhesive material 118, thereby bonding the carrier wafer 122 to the GaN material layer 104. The carrier wafer 122 may comprises a silicon, glass, a polymer, or an elastomer, for example.

In implementations, the first releasable adhesive material 114 comprises an existing adhesive material known to skilled artisans. In embodiments, the second releasable adhesive material 118 is selected from: a heat-releasable tape, an ultra-violet releasable tape, an organic releasable adhesive, an inorganic releasable adhesive, a stacked combination of releasable tape and organic releasable adhesive, a stacked combination of releasable tape and inorganic releasable adhesive, a stacked combination of releasable adhesive and laser release material, or a stacked combination of releasable tape, releasable adhesive and laser release material.

Optionally, the carrier wafer package 116 comprises a laser release film 120 connecting the carrier wafer 122 to the second releasable adhesive material 118, and the carrier wafer 122 is transparent to enable light to reach the laser release film 120. The laser release film 120 may comprise a laser release layer (LRL) adhesive, polymer, or tape, which loses adhering properties when exposed to laser light. Various existing LRL polymers or tapes may be utilized. In implementations, the laser release film 120 is an infrared or ultraviolet (UV)-responsive organic or inorganic material. In embodiments, the second releasable adhesive material 118 comprises a heat-releasable polymer or tape which loses adhering properties when exposed to heat. It should be understood that the carrier wafer package 116 may comprise various combinations of the carrier wafer 122 with one or more layers of adhesives, and the carrier wafer package 116 is not intended to be limited to only the example shown.

Figure 1G:
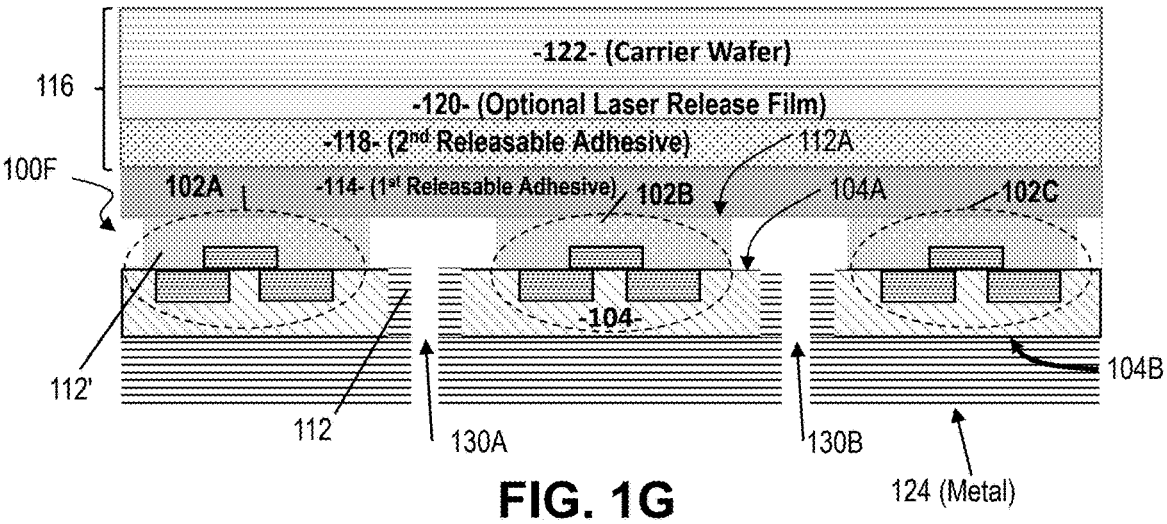
FIG. 1G is a cross-sectional side view of a stage of the GaN engineered wafer of FIG. 1A, with the non-crystalline substrate removed, and a metal layer attached to the bottom side of the GaN material layer in accordance with embodiments of the invention.

FIG. 1G is a cross-sectional side view of a stage 100F of the GaN engineered wafer of FIG. 1A, with the non-crystalline substrate 108 removed, and at least one metal layer 124 (hereafter metal layer 124) attached to the bottom side 104B of the GaN material layer 104 in accordance with embodiments of the invention. In implementations, the GaN material layer 104 is released from the non-crystalline substrate 108 via breaking or removal of the tether portions 113A, 113B of the tether material layer 112. In implementations, mechanical methods are used to break the tether portions 113A, 113B, such as mechanical fracturing or mechanical breaking of the tethers. Optionally, chemical or plasma removal methods are utilized to remove the tether portions 113A, 113B of the tether material layer 112. In embodiments, a portion of the tethers or the entirety of the tethers can be removed by etching to release the GaN material layer 104 from the non-crystalline substrate 108. The metal layer 124 is then deposited onto the bottom side 104B of the GaN material layer 104. In implementations, the metal layer 124 is deposited via a process that uses an adhesion metal, a seed metal, and copper electroplating, or by a process that deposits an adhesion metal and then deposits a copper deposited metal layer. In embodiments, the material of the metal layer 124 fills in the trenches 110A, 110B. Optionally, as depicted in FIG. 1G, new trenches 130A, 103B may be cut through the metal layer 124, the GaN material layer 104, the protective layer 112' (when present), and the tether material layer 112 to singulate die portions of the GaN engineered wafer.

Figure 1H:
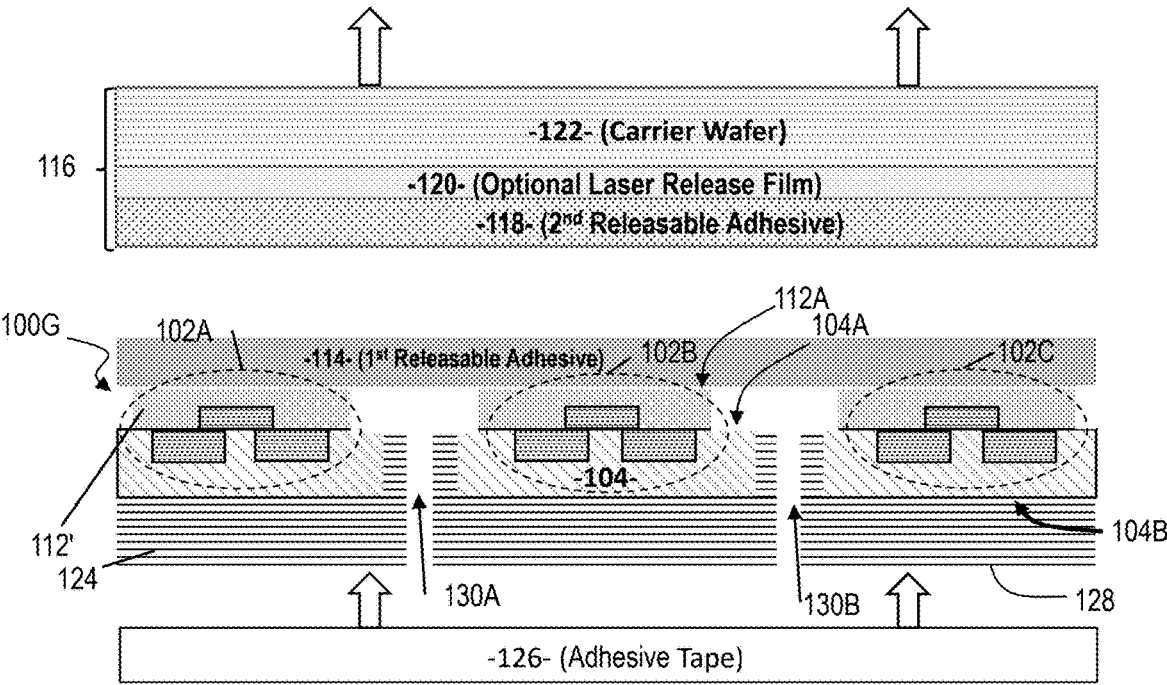
FIG. 1H is a cross-sectional side view of a stage of the GaN engineered wafer of FIG. 1A, with the carrier wafer removed and an adhesive tape added to a bottom side of the metal layer in accordance with embodiments of the invention.

FIG. 1H is a cross-sectional side view of a stage 100G of the GaN engineered wafer of FIG. 1A, showing an adhesive tape or polymer 126 being added to a bottom side 128 of the metal layer 124 in accordance with embodiments of the invention. The adhesive tape 126 may comprise a dicing tape, a chemically resistant dicing tape, a UV releasable tape, a chemically resistant UV releasable tape, a heat releasable tape, or a chemically resistant heat releasable tape, for example. In implementations, the adhesive tape 126 comprises polyethylene or polyvinyl chloride (PVC).

In implementations, the carrier wafer package 116 is removed from the first releasable adhesive material 114, such as by heating the GaN engineered wafer, for example. In embodiments, the carrier wafer 122 is removed by exposing the laser releasable film 120 to laser light to release the releasable film 120 from the second releasable adhesive material 118. The second releasable adhesive material 118 may then be removed (e.g., via heating).

Figure 1I:
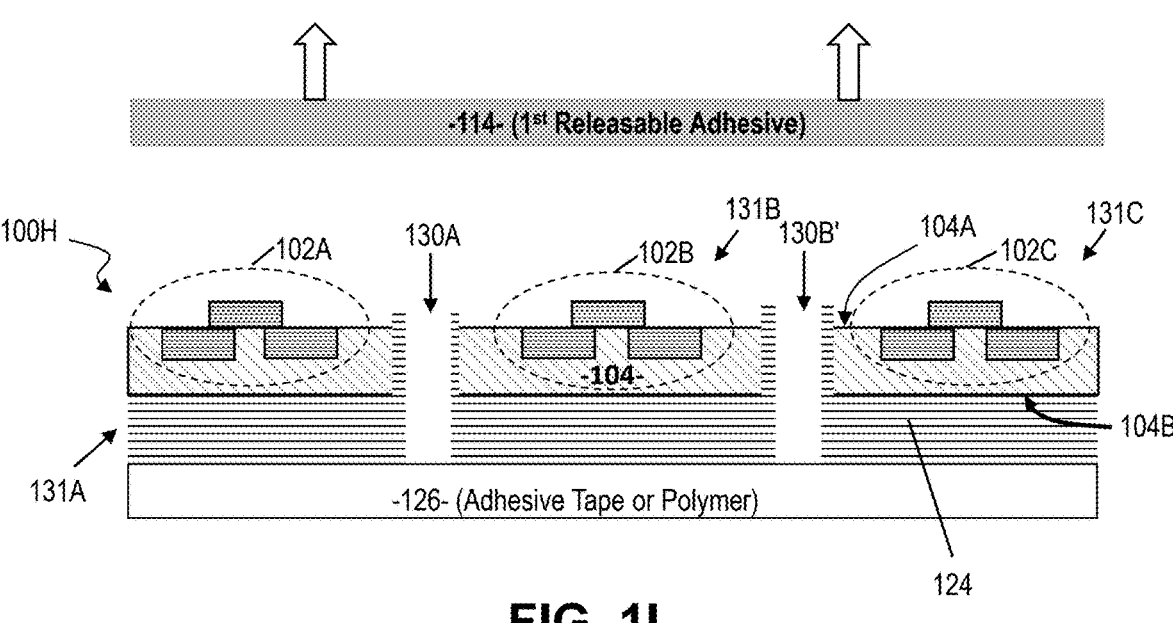
FIG. 1I is a cross-sectional side view of a stage of the GaN engineered wafer of FIG. 1A, with the releasable tape removed, resulting in transportable singulated die.

FIG. 1I is a cross-sectional side view of a stage 100H of the GaN engineered wafer of FIG. 1A, with the first releasable adhesive material 114, protective material 112' (when used), and tether material 112 removed, resulting in transportable singulated GaN device die 131A, 131B, 131C connected by the adhesive tape or polymer 126. In implementations, a chemically resistant adhesive tape or polymer 126 allows the protective material 112', if present on the first surface of the GaN device die, to be removed by chemical etching after the removal of the first releasable adhesive material 114. In embodiments, a chemically resistant adhesive tape or polymer 126 allows any remnants of the tethers material layer 112 on the sides and top surface of the GaN device die to be removed by chemical etching, after the removal of the first releasable adhesive material 114.

In implementations, the singulated GaN device die 131A, 131B, 131C have high thermal conductivity in the range of 170 W/mK to 230 W/mK. In aspects of the invention, the singulated GaN device die 131A, 131B, 131C do not include a GaN/SiC interface, and therefore do not have a thermal boundary resistance that results from such an interface. In embodiments, the GaN material layer of each of the singulated GaN device die 131A, 131B, 131C do not have any grind damage, as they are not subjected to any grinding process.

While not shown, various optional backside processes may be implemented in accordance with embodiments of the invention. Optional processes include, for example, chemically or plasma etching of photoresist tethers, photolithography, metal deposition, chemical-mechanical (CMP) polishing, depositing a seed layer, electroplate metal deposition, plasma etching of a silicon (Si111) layer, plasma etching of an aluminum nitride nucleation layer, plasma etching of a III-nitride material, plasma etching of metal, laser annealing, laser singulation of die, electrodischarge machining of metal to singulate die, etc.

Figure 2A:
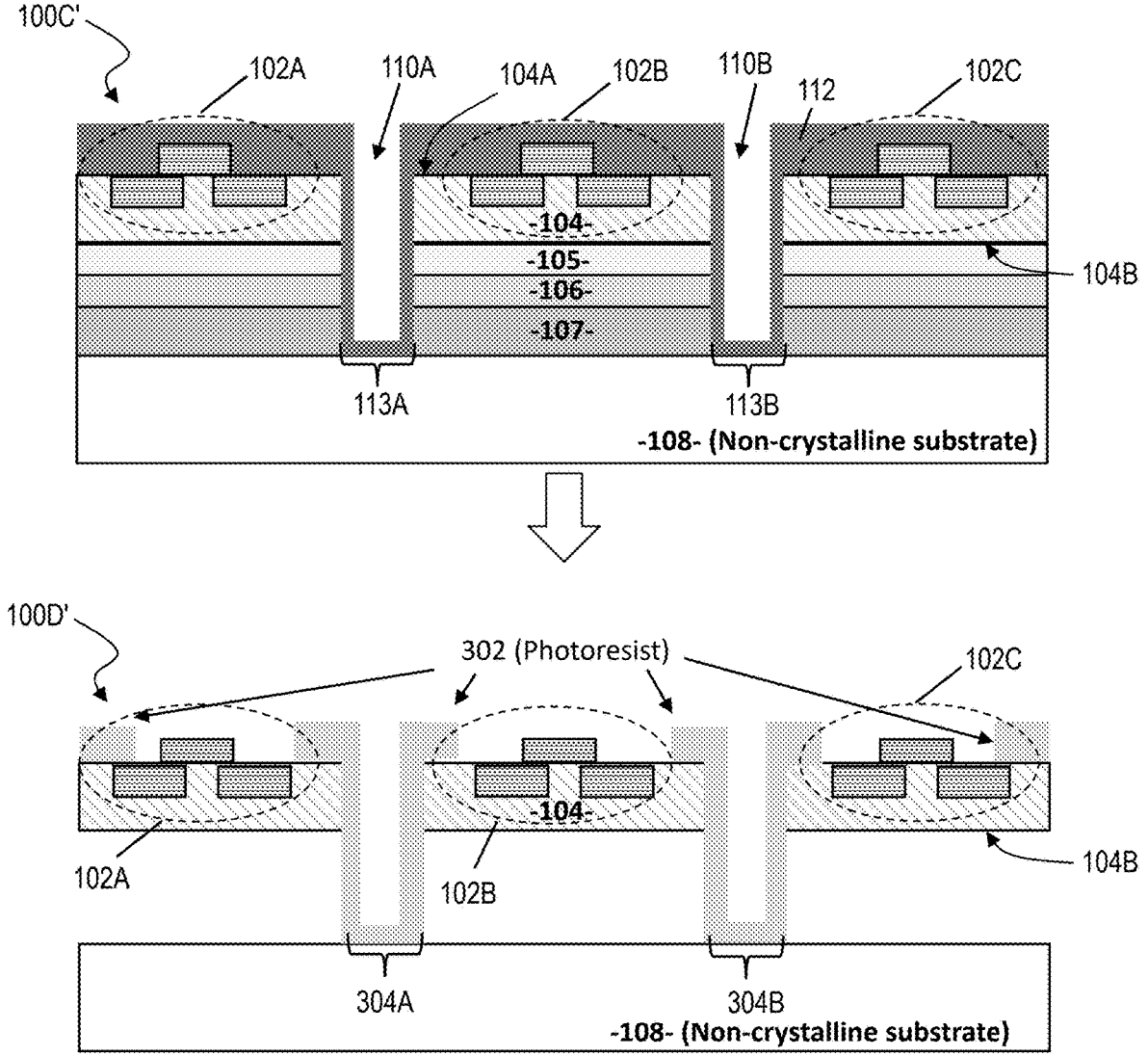
FIG. 2A is a cross-sectional side view of an alternative stage of the GaN engineered wafer of FIG. 1A, with a second set of tethers formed thereon in accordance with embodiments of the invention.

FIG. 2A is a cross-sectional side view of an alternative stage 100C' of the GaN engineered wafer of FIG. 1A, without a protective layer 112' and with a second set of tethers 304A and 304B formed thereon in accordance with embodiments of the invention. More specifically, in implementations, after intermediate layers 105, 106 and 107 of the GaN engineered wafer 100C' are removed via etching, a second tether material layer comprising a photoresist 302 is deposited over a portion of the top surface of the GaN engineered wafer, and photolithography is performed to create a second set of tethers 304A and 304B extending between the GaN material layer 104 and the non-crystalline substrate layer 108, as depicted in the cross-sectional side view 100D'. While the cross-section of 100D' shows only the second set of tethers, 304A, 304B, one of ordinary skill in the art would understand that the first set of tethers 113A, 113B and second set of tethers 304A, 304B would interconnect different portions of the GaN material layer 104 to the non-crystalline substrate 108, in accordance with embodiments of the invention. See, for example, the embodiment in FIG. 3B.

Figure 2B:
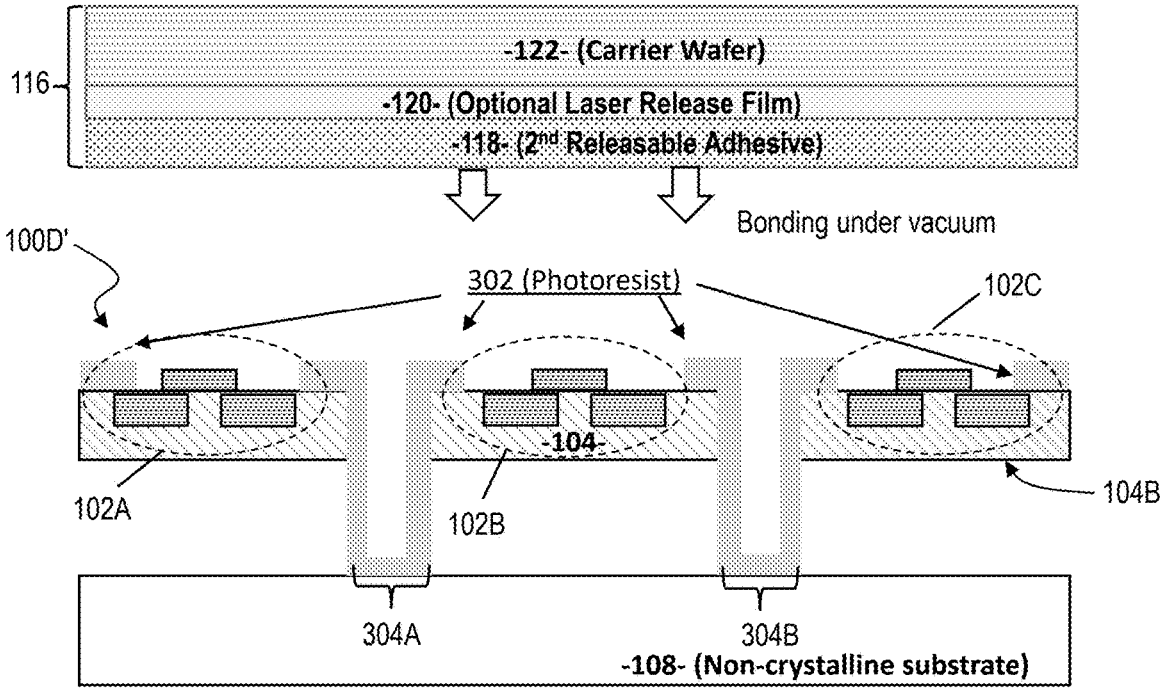
FIG. 2B is a cross-sectional side view of another stage of the GaN engineered wafer of FIG. 2A, with a carrier wafer being added thereto in accordance with embodiments of the invention.

FIG. 2B is a cross-sectional side view of an alternative stage 100D' of the GaN engineered wafer of FIG. 1A, with a carrier wafer package 116 being added thereto in accordance with embodiments of the invention.

Figure 2C:
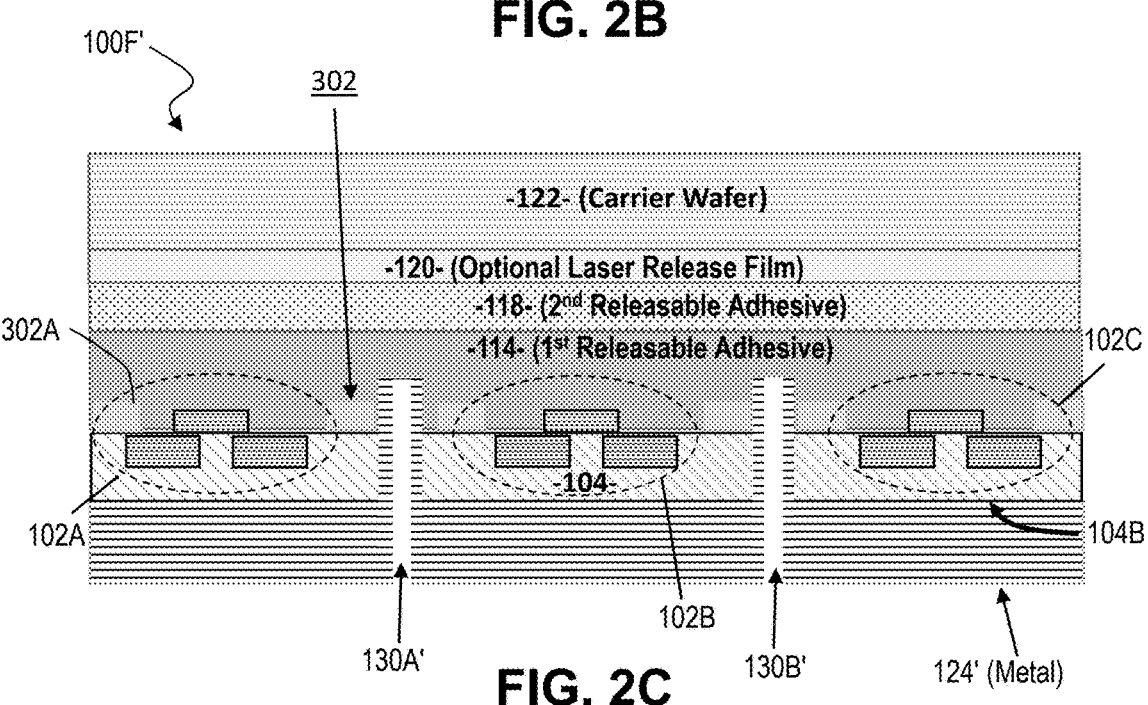
FIG. 2C is a cross-sectional side view of a stage of the GaN engineered wafer of FIG. 2B with the non-crystalline substrate layer removed and an metal layer attached to the bottom side of the GaN material layer in accordance with embodiments of the invention.

FIG. 2C is a cross-sectional side view of a stage 100F' of the GaN engineered wafer of FIG. 2B with the non-crystalline substrate layer 108 removed and a metal layer 124' attached to the bottom side 104B of the GaN material layer 104, in accordance with embodiments of the invention. The metal layer 124' may comprise one or more layers in accordance with embodiments of the invention. In implementations, the tether material layer 112 (depicted in in FIG. 2A) is chemically etched to remove the tether material layer 112 and associated set of first tethers 113A, 113B, leaving the second set of tethers 304A, 304B. In the example shown, the first releasable adhesive material 114 is adhered to a top surface 302A of the photoresist layer 302, and a carrier wafer 122 is bonded under vacuum to the first releasable adhesive material 114 via the second releasable adhesive material 118, thereby bonding the carrier wafer 122 to the GaN material layer 104. In the example of FIG. 2C, the non-crystalline substrate 108 has been removed, and the metal layer 124' has been applied to a bottom surface 104B of the GaN material layer 104.

Figure 2D:
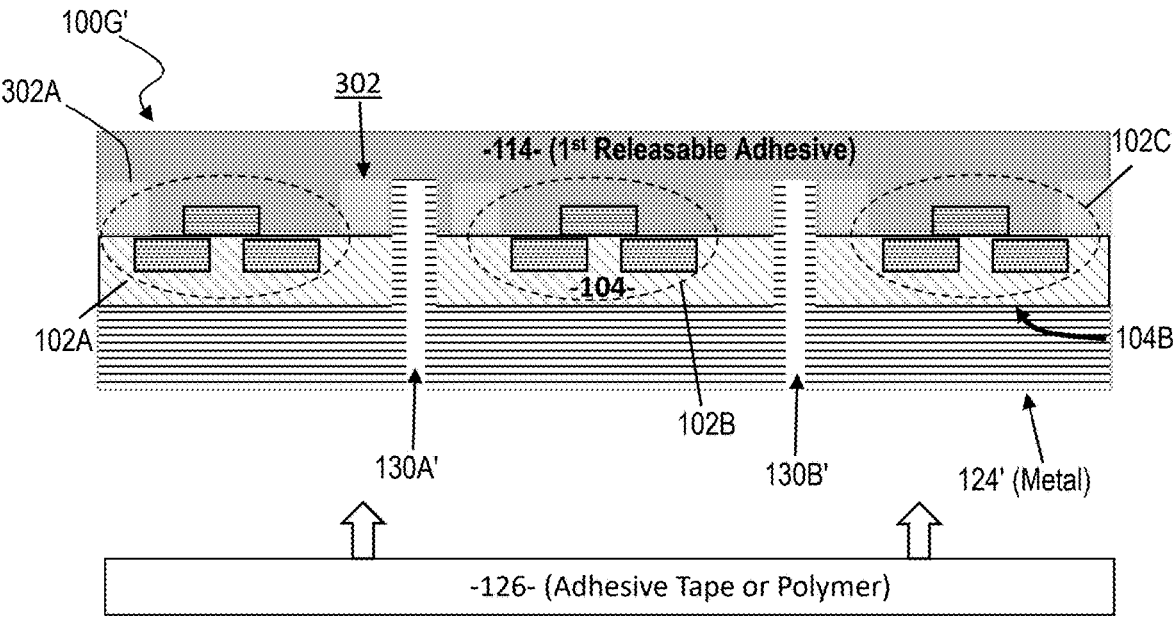
FIG. 2D is a cross-sectional side view of a stage of the GaN engineered wafer of FIG. 2C with the carrier wafer removed and an adhesive tape added to the metal layer in accordance with embodiments of the invention.
Figure 2E:
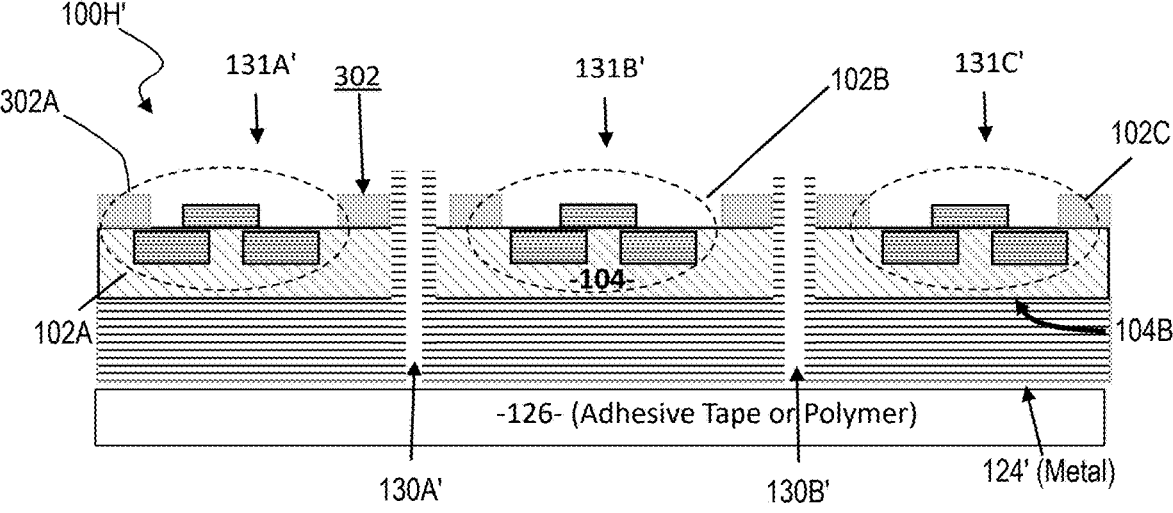
FIG. 2E is a cross-sectional side view of a set of interconnected GaN device die in accordance with embodiments of the invention.

In implementations, the GaN device die can be singulated after the metal layer 124' has been applied to the bottom surface 104B of the GaN material layer 104, or after the metal layer 124' is adhered to an adhesive tape 126 (e.g., at stage 100H' shown in FIG. 2E). The advantage of singulating the GaN device die while adhered to the carrier wafer 122 is that the bottom surface of metal layer 124' can be bonded to a metal layer 124' comprising a copper heat sink or flange comprising copper using solder, fluxless thermal compression bonding, or direct interconnect hybrid bonding. In embodiments, the second releasable adhesive material 118 allows a solder temperature or fluxless thermal compression bonding temperature in the range of 200° C. to 300° C. In embodiments, a releasable inorganic adhesive forming the laser release layer 120 allows a solder temperature or fluxless thermal compression temperature of more than 300° C. In implementations, trenches 130A', 130B' are cut through the metal layer 124' using plasma etching, laser cutting, or electrodischarge machining, for example. Metal layer 124' (e.g., in the form of a copper heat sink or flange comprising copper) can be polished to a surface roughness less than 200 nm RMS to facilitate soldering to copper or fluxless thermal compression bonding. In implementations, passivating metals such as titanium or tin are deposited on the surface of metal layer 124' to prevent oxidation of the copper layer and allow fluxless thermal compression bonding at less than 250° C. In embodiments, the metal layer 124' comprises a copper-molybdenum-copper flange where the center molybdenum layer reduces the effective coefficient of thermal expansion relative to a copper only flange.

FIG. 2D is a cross-sectional side view of a stage 100G' of the GaN engineered wafer of FIG. 2C with the carrier wafer package 116 removed and the adhesive tape 126 bonded (added) to the metal layer 124' in accordance with embodiments of the invention. In implementations, the carrier wafer package 116 is removed from the first releasable adhesive material 114 by heating the GaN engineered wafer or laterally sliding the carrier wafer package 116 with respect to the GaN engineered wafer, for example. In embodiments, the carrier wafer 122 is removed by exposing the optional laser release layer film 120 to laser light to release the film 120 from the second releasable adhesive material 118. The second releasable adhesive material 118 may then be removed (e.g., via heating).

The GaN device die can be singulated by sawing, laser cutting, plasma etching, or electrodischarge machining through metal layer 124'. In embodiments, trenches 130A', 130B' are formed by cutting through the metal layer 124' using plasma etching, laser cutting, or electrodischarge machining, while attached to adhesive tape (dicing tape) 126 (if the GaN device die are not previously singulated by making trenches 130A' and 130B' through metal layer 124'). In some implementations, chemical or plasma etching steps are added to remove remnants of the tethers or a GaN device die protective layer (e.g., 112') before or after singulating the GaN device die.

In some embodiments, after the GaN device die are singulated while attached to the adhesive tape 126, the GaN device die (e.g., 100G') are picked and placed from the adhesive tape 126 and transferred to be bonded to a copper heat sink or a copper based flange. In some embodiments, the GaN device die are: transferred and bonded to a package; transferred and bonded to a diamond substrate; transferred and bonded to a flexible substrate; or transferred and bonded to an acoustic reflector for a bulk acoustic wave device. In some implementations, the GaN device die are transferred and bonded to an integrated circuit to form a heterogeneous integrated circuit.

In embodiments, after the GaN device die 100G' are singulated while attached to adhesive tape 126, the GaN device die 100G' is picked and placed and bonded face-to-face or back-to-face to an integrated circuit. In implementations, a pick-and-place tool can implement a flip of the GaN device die 100G' within the pick-and-place tool by a process of first supporting the die on the front side, then supporting the die on the back side, then releasing the support front side, and performing a flip to enable face-to-face bonding to an integrated circuit.

FIG. 2E is a cross-sectional side view of a stage 100H' of the GaN engineered wafer of FIG. 2D with the first releasable adhesive material 114 removed, resulting in transportable singulated GaN device die 131A', 131B', 131C' connected via the adhesive tape or polymer 126. In implementations, the singulated GaN device die 131A', 131B', 131C' have high thermal conductivity in the range of 170 W/mK to 230 W/mK. In aspects of the invention, the singulated GaN device die 131A', 131B', 131C' do not include a GaN/SiC interface, and therefore do not have a thermal boundary resistance that results from such an interface. In embodiments, the GaN material layer of each of the singulated GaN device die 131A', 131B', 131C' does not have any grind damage, as they are not subjected to any grinding process.

Figures 3A, 3B:
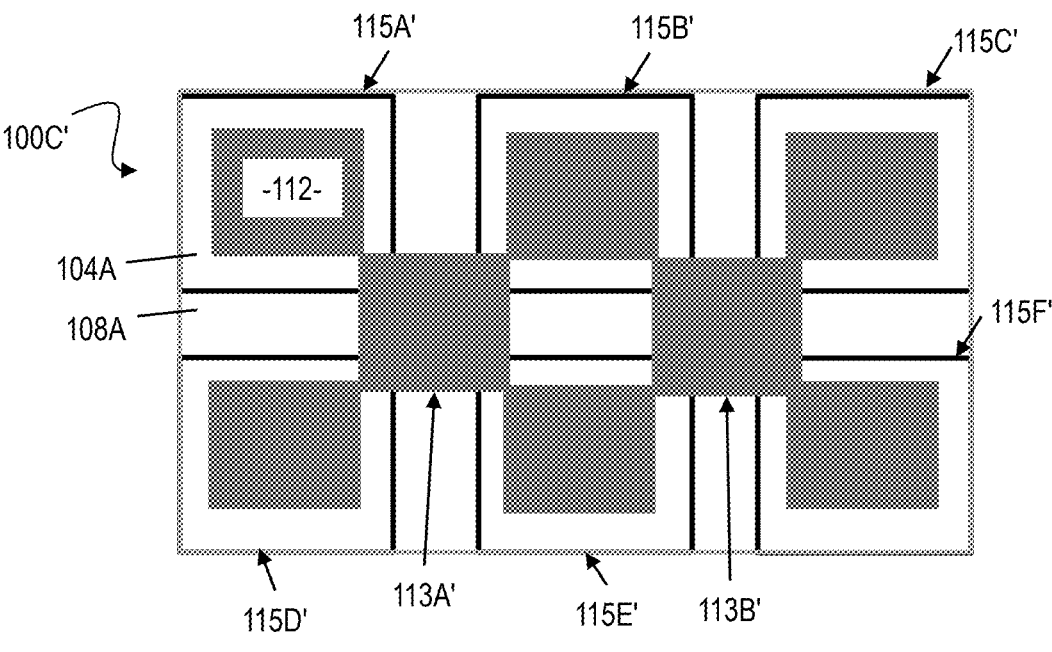
FIG. 3A is a top view of the GaN engineered wafer of FIG. 2A prior to the addition of a second set of tethers.
FIG. 3B is a top view of the GaN engineered wafer of FIG. 2A after the addition of a second set of tethers.

FIG. 3A is a top view of a stage 100C' of the GaN engineered wafer of FIG. 2A prior to the addition of a second set of tethers in accordance with embodiments of the invention. In the example of FIG. 3A, a first set of tethers (e.g., 113A and 113B) extend between a top surface of the GaN material layer 104A and a top layer 108A of the non-crystalline substrate 108.

FIG. 3B is a top view of a stage 100C" of the GaN engineered wafer of FIG. 2A after the addition of the second set of tethers (e.g., 304A, 304B) in accordance with embodiments of the invention.

Figure 3C:
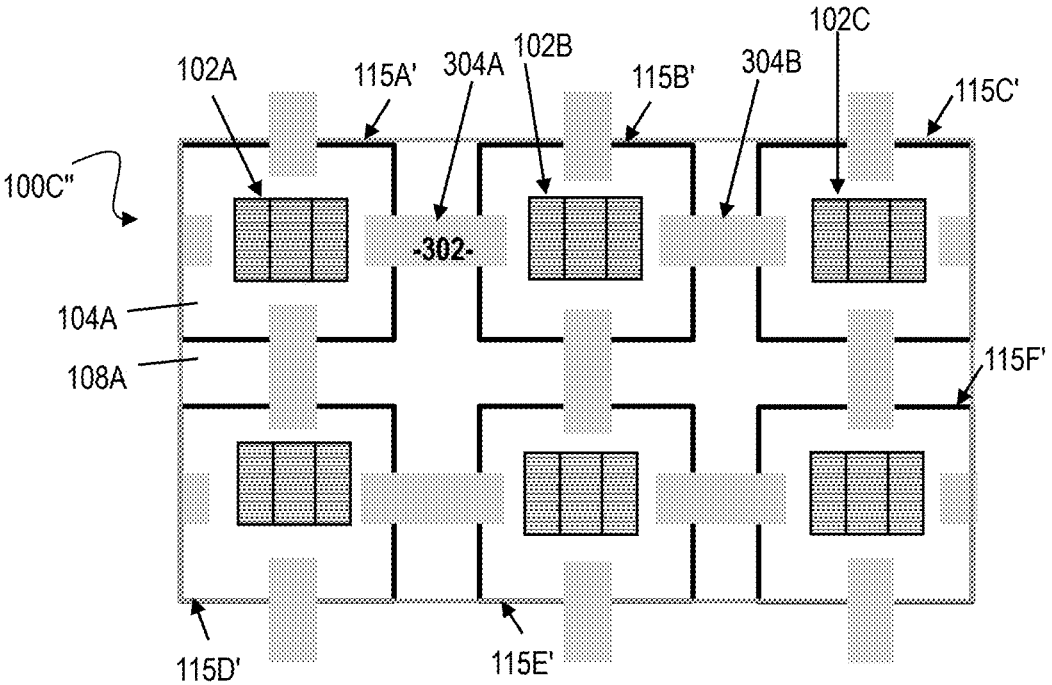
FIG. 3C is a top view of the GaN engineered wafer of FIG. 2E, with the tether material and the first set of tethers removed.

FIG. 3C is a top view of the stage 100H' of the GaN engineered wafer of FIG. 2E, with the tether material layer (e.g., 112) and the first set of tethers (e.g., 113A', 113B') removed in accordance with embodiments of the invention.

It should be understood that the various stages of the exemplary GaN engineered wafer depicted in FIGS. 1A-1I, 2A-2E, and 3A-3C are not intended to represent all stages of GaN engineered wafers of the present invention, and implementations of the invention may include other stages of the GaN engineered wafer not pictured.

Figure 4A:
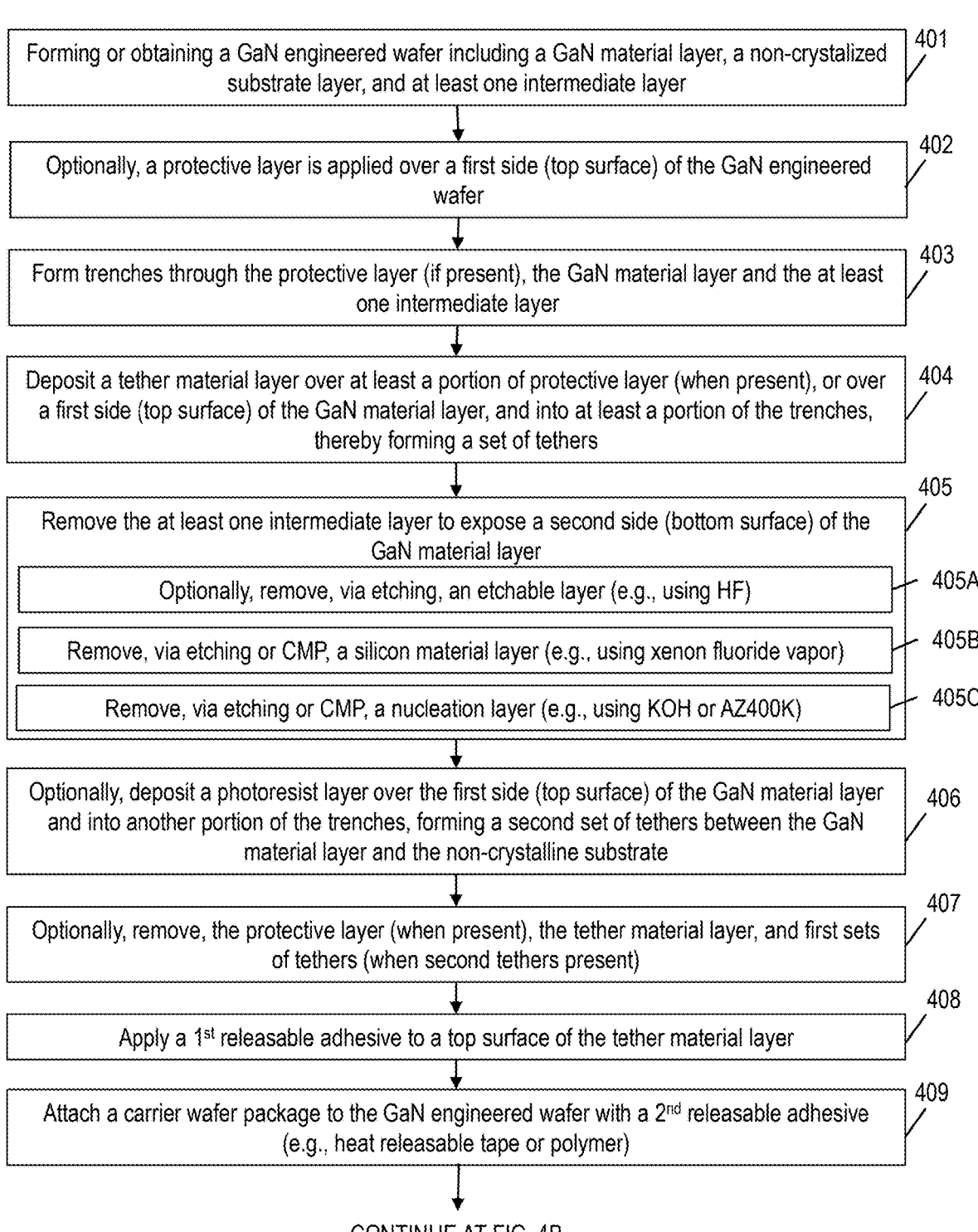

FIGS. 4A-4B show a flowchart of an exemplary method in accordance with aspects of the present invention. The method steps of FIGS. 4A-4B may include steps and/or stages illustrated in FIGS. 1A-1I and FIGS. 2A-2E.

At step 401, a GaN engineered wafer (e.g., 100A) is obtained or manufactured. The GaN engineered wafer includes a GaN material layer (e.g., 104), a non-crystalline substrate layer (e.g., 108), and at least one intermediate layer (e.g., 109) between the GaN material layer and the non-crystalline substrate layer. In implementations, the intermediate layer comprises a nucleation layer (e.g., 105), a silicon material layer (e.g., 106), and an etchable material layer (e.g., 107). In some embodiments, one or more device elements (e.g., 102A-102C) are formed in and/or on the GaN material layer.

Optionally, at step 402 a protective material layer (e.g., 112') is deposited over devices (e.g., 102A, 102B, 102C) on the GaN material layer (e.g., 104). In implementations, when a tether material layer deposited at step 404 is not comprised of a protective material, the protective material may be used to protect at least a portion of the GaN material layer (e.g., 104) and any device elements (e.g., 102A) thereon. In implementations, the protective material is an HF-resistant material. The protective material may comprise a photoresist material, silicon carbide, silicon nitride, aluminum, a wax, or other protective material known to a skilled artisan.

At step 403, trenches (e.g., 110A, 110B) are formed in the protective layer (e.g., 112') if present, the GaN material layer (e.g., 104), and into at least a portion of the intermediate layer(s) (e.g., 109). In implementations, the trenches expose sides of etchable intermediate layers (e.g., 105, 106, and 107). The trenches may be formed via etching, sawing, or laser cutting, for example, and the invention is not intended to be limited to a particular method of forming trenches.

At step 404, a tether material layer (e.g., 112) is deposited over at least a portion of the protective layer (e.g., 112') when present, or over the top surface (e.g., 104A) of the GaN material layer (e.g., 104), and in the trenches (e.g., 110A, 110B) to form a set of tethers (e.g., 113A, 113B or 113A', 113B') between the GaN material layer and the non-crystalline substrate (e.g., 108). Optionally, the tether material forms a protective layer over the top surface of the GaN material layer and any device elements thereon. See stage 100C' of FIG. 2A, for example. In implementations, the HF-resistant tether material layer (e.g., 112) is formed via photolithography, and the HF-resistant tether material layer comprises an HF-resistant photoresist. In implementations, the tether material comprises aluminum or alloys of aluminum formed via subtractive etching.

At step 405, the at least one intermediate layer (e.g., 109) is removed. The at least one intermediate layer may be removed by plasma etching, chemically etching, or chemical mechanical polishing, for example, to expose a second side (e.g., bottom side 104B) of the GaN material layer (e.g., 104). Advantageously, step 405 results in the bottom surface (e.g., 104B) of the GaN material layer being exposed without the need for wafer back grinding or wafer thinning of the GaN material layer. In implementations, the intermediate layer includes a nucleation layer (e.g., 105) and a silicon material layer (e.g., 106) removed via plasma etching, chemical etching, or chemical mechanical polishing (CMP). In embodiments, the at least one intermediate layer comprises an etchable layer, a silicon material layer, and a nucleation layer (e.g., 107, 106, 105). In accordance with such embodiments, step 405 comprises the following substeps.

At substep 405A, the etchable layer is removed, via etching. In implementations, the etchable layer is an HF etchable layer and the etching uses HF (e.g., using 5% HF, anhydrous HF vapor, or liquid 48% HF plus oleum).

At substep 405B, the silicon material layer is removed, via etching or CMP. In implementations, substep 405B comprises etching using xenon fluoride vapor.

At substep 405C, the nucleation layer is removed, via etching or CMP. In embodiments, the nucleation layer is an AlN nucleation layer and substep 405C comprises etching using AZ® 400K developer or KOH.

Once the bottom surface of the GaN material layer (e.g., 104) is exposed, a new layer or layers (e.g., a metal layer 124, 124') may be deposited directly onto the bottom surface (e.g., 104B) of the GaN material layer (e.g., 104). In implementations, the interface between the GaN material layer and the new layer is relatively smooth and defect free due, in part, to the lack of physical processing of the bottom surface of the GaN material layer (e.g., grinding). Prior to depositing a new layer onto the GaN material layer, one or more handling steps may be implemented to enable physical handling/transferring of the GaN engineered wafer. The following steps are exemplary handling steps that may be utilized in accordance with implementations of the invention.

Optionally, a two tether approach may be utilized. In such implementations, at step 406, a photoresist layer is deposited over the first side (top surface) of the GaN material layer and into another portion of the trenches (at locations different from the first set of tethers), forming a second set of tethers (e.g., 304A, 304B). See FIG. 3B, for example, showing a first set of tethers (e.g., 113A', 113B') and the second set of tethers (e.g., 304A, 304B).

Optionally, at step 407, when the two-tether approach is utilized, the protective material layer (e.g., 112' when present), tether layer (e.g. 112), and the associated first set of tethers (e.g., 113A', 113B') are removed, whereby the GaN material layer (e.g., 104) continues to be tethered to the non-crystalline substrate (e.g., 108) by the second set of tethers (e.g., 304A, 304B). In embodiments, the protective material layer (e.g., 112' when present), and tether material layer (e.g., 112) are removed by etching.

At step 408, a first releasable adhesive material (e.g., 114) is applied to a top surface (e.g., 112A, 302A) of the GaN engineered wafer. The first releasable adhesive material (temporary bonding material) may be selected from: a heat-releasable tape, a chemically resistant heat releasable tape, an ultra-violet releasable tape, a chemically resistant ultraviolet releasable tape, a chemically resistant adhesive, an organic releasable adhesive, an inorganic releasable adhesive, an elastomer, a laser release layer film, and combinations thereof. In embodiments, the first releasable adhesive material (temporary bonding material) comprises a stacked combination of releasable materials or releasable adhesives. In embodiments, a second adhesive material (e.g., 118), and an optional laser release layer (e.g., 120) are utilized in conjunction with a carrier wafer 122. In embodiments, a stacked combination of a first releasable adhesive 114, a second releasable adhesive 118, a laser release layer 120, and a carrier wafer 122, is utilized. See, for example, FIG. 1H. In implementations, when print transfer and collective print transfer technologies are utilized, an elastomer may be used as the first releasable adhesive.

In implementations the first releasable adhesive material (temporary bonding material) is applied to the protective material (e.g., 112') and the tether material layer (e.g., 112, 113). In embodiments, the first releasable adhesive material (temporary bonding material) is applied to the photoresist (e.g., 302). In embodiments, the first releasable adhesive material is chemically resistant to copper etchants.

At step 409, a carrier wafer package (e.g., 116), is attached to the GaN engineered wafer (e.g., 100E) via the second releasable adhesive material (e.g., temporary bonding material 118) layer. In an embodiment, the second releasable adhesive material comprising a stacked combination of an optional laser release layer film (e.g., 120) attached to a second releasable adhesive material (e.g., 118) that attaches to the first releasable polymer or tape (e.g., 114) applied to the top surface of the GaN engineered wafer, thereby connecting the carrier wafer package to the GaN engineered wafer. See, for example, FIG. 1F. The second releasable adhesive layer (e.g., 118) may be a heat releasable polymer or a chemically etchable polymer, or a laser-release layer (LRL) organic or inorganic layer, for example. An advantage of including an adhesive tape in contact with the GaN device die is that the tape maintains the spatial location of the GaN device die when the wafer carrier (e.g., 122) is removed. The wafer carrier package provides mechanical strength to laterally translate the carrier wafer package relative to the GaN wafer to break the tethers, to lift the carrier wafer relative to the GaN wafer to break the tethers, or to peel the carrier wafer relative to the GaN wafer to break the tethers. In implementations, the carrier wafer 122 is an elastomer.

At step 410, the non-crystalline substrate (e.g., 108) is removed from the channels (e.g., 110A, 110B) of the GaN engineered wafer (e.g., 100E), such as through a mechanical lateral motion, a mechanical lifting motion, or a mechanical peeling motion, for example.

Optionally, at step 412, at least one new layer (e.g., a metal layer 124 or 124') is deposited on the GaN engineered wafer. In embodiments, the new layer is deposited on the bottom surface (e.g., 104B) of the GaN material layer (e.g., 104). See, for example, the metal layer 124 in FIG. 1G. In one example, the at least one new layer comprises an adhesion metal layer and a copper layer. In implementations, at step 412, a seed metal is deposited on the GaN engineered wafer, along with a photolithography layer and a layer of electroplated metal.

At step 413, new trenches (e.g., 130A, 130B) are cut into the at least one new layer of the GaN engineered wafer (e.g., to singulate GaN devices die 131A, 131B, 131C). See FIG. 1G, for example. Various methods of creating new trenches may be utilized, such as laser cutting and electrodischarge machining, for example, and the present disclosure is not intended to be limited to examples discussed herein.

At step 414, the carrier wafer package (e.g., 116) is released from the GaN engineered wafer. See, for example, FIG. 1H. In implementations, the GaN engineered wafer is heated to a temperature needed to release a heat-releasable adhesive layer (e.g., 118) of the carrier wafer package from the first releasable adhesive material (e.g., 114). In embodiments, laser illumination of a laser release layer adhesive layer (e.g., 120) is used to release the carrier wafer package from the first releasable adhesive (e.g., 114).

At step 415, an adhesive tape or polymer layer (e.g., 126) is attached to a bottom surface (e.g., 128) of the at least one new layer (e.g., metal layer 124). In embodiments, the adhesive tape or polymer layer is chemically resistant (e.g., HF resistant).

At step 416, the first releasable adhesive material (e.g., 114) is removed from the top of the GaN engineered wafer. In embodiments, the first releasable adhesive material is a UV releasable tape that is removed by applying a UV source to the releasable tape.

At step 417, any remaining protective layer (e.g., 112') and any remaining tether material layer (e.g., 112) are removed from the GaN engineered wafer (e.g., 100H). In embodiments, the protective layer and/or tether material layer are removed by chemical etching using plasma or acetone for photo resist and aluminum etch for aluminum tether. This results in a plurality of singulated GaN device die (e.g., 131A, 131B and 131C) held together by the adhesive tape or polymer layer (e.g., 126).

Optionally, at step 418, one or more back-end steps may be performed. In one example, step 418 includes etching kerf lines in the at least one new layer (e.g., 124). In another example, step 418 includes the step of moving singulated GaN device die via pick-and-place procedures, or transferred using a microtransfer printing process, a collective microtransfer printing process, a die to wafer process, or a collective die to wafer process.

In alternative embodiments, the carrier wafer package (e.g., 116) is not removed from the GaN engineered wafer at step 414, the first releasable adhesive (e.g., 114) is not removed at step 416, and the wafer carrier package (e.g., 116) with attached GaN device die or material can be singulated by sawing, plasma etching, or laser cutting at step 413. In such embodiments, the diced wafer carrier package can mechanically support thin GaN device die during a pick and place process. The diced wafer carrier package with attached thin GaN device die or material can be bonded to a diamond substrate, bonded to an acoustic reflector to form bulk acoustic wave device, or bonded to a copper heat sink or copper flange, for example. Unless otherwise specified, the steps of FIGS. 4A and 4B need not be in the order shown.

Figure 5:
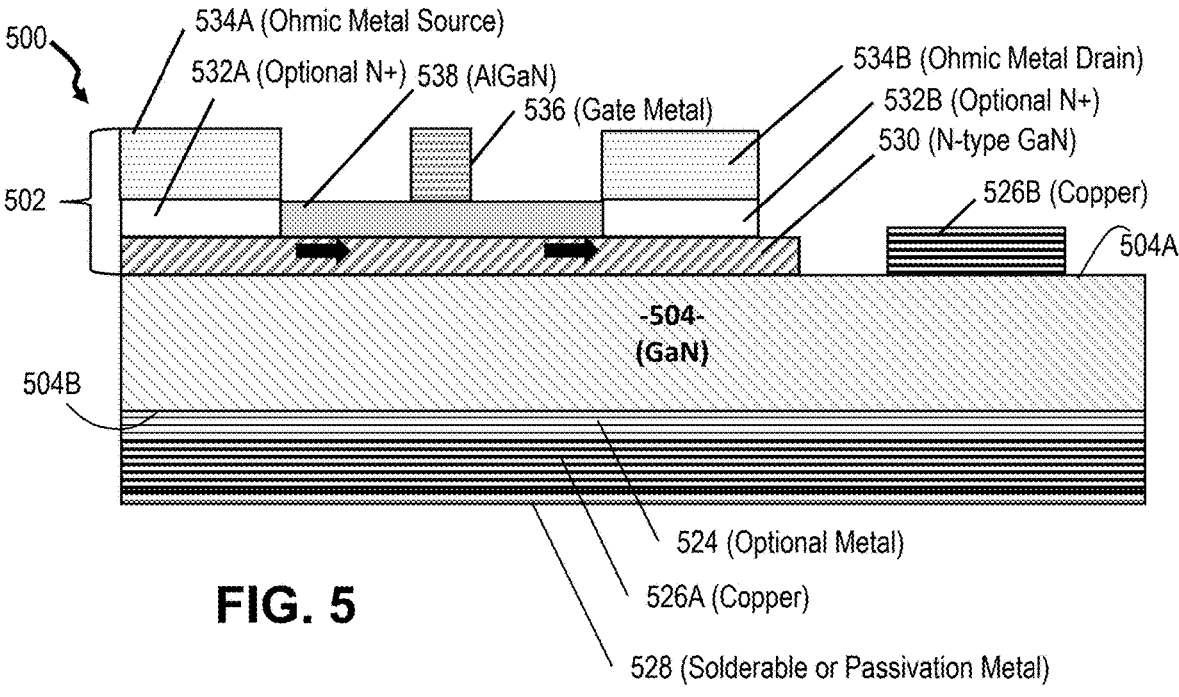
FIG. 5 is a side view of a first exemplary GaN device made in accordance with embodiments of the invention.

FIG. 5 is a side view of a first exemplary GaN device 500 made in accordance with wafer-level methods discussed above. As depicted, the GaN device 500 includes a GaN material layer 504 including a number of device elements formed on a first (top) surface 504A thereof, which are generally indicated at 502. The device elements 502 may be device elements of an original GaN engineered wafer, such as the device elements 102A of the GaN engineered wafer 100A in FIG. 1A. Optionally, a metal 524 may be added to a second (bottom) surface (e.g., 504B) of the GaN material layer 504 in accordance with embodiments discussed above. See, for example, the addition of a metal 124 to a second (bottom) surface 104B of a GaN layer 104 in FIG. 1G.

In the example of FIG. 5, a copper layer 526A has been deposited on a bottom surface of the metal layer 524 to act as a copper ground plane. In embodiments, the copper layer 526A acts as a mechanical support and means for thermal conductivity. Alternatively, the copper layer 526A may be deposited directly on the GaN material layer 504 without the use of an intermediate metal 524. A solderable metal layer or passivation metal layer 528 is deposited on a bottom surface of the copper layer 526A. In implementations, the solderable or passivation metal layer 528 may act as a barrier layer to reduce oxidation of the bottom surface of the copper layer 526A and aid in copper-copper thermal compression bonding. The solderable or passivation metal layer 528 may comprise gold (Au), a nickel and copper alloy (NiCu), palladium (Pd), titanium (Ti), or tin (Sn), for example. The addition of the copper layer 526A and the solderable or passivation metal layer 528 to a GaN engineered wafer may be performed at the wafer-level manufacturing stage or as a back-end stage (e.g., after singulation of GaN device die from the original GaN engineered wafer).

Additionally, GaN device 500 includes a copper conductor 526B on a top surface 504A of the GaN material layer 504 which, in conjunction with the copper ground plane, forms a microstrip transmission line. The addition of the copper conductor 526B may be performed at the wafer-level manufacturing stage or as a back-end stage (e.g., after singulation of GaN device die from the original GaN engineered wafer).

In the example of FIG. 5, the device elements 502 of the GaN device 500 include: an N-type GaN layer 530; an ohmic metal source 534A; an ohmic metal drain 534B; optionally, respective N+ material layers 532A and 532B between the ohmic metal source 534A and metal drain 534B and the N-type GaN layer 530; an aluminum gallium nitride (AlGaN) layer 538 above the N-type GaN layer 530 positioned between the ohmic metal source 534 and the ohmic metal drain 534B; and a gate metal 536 on the AlGaN layer 538. The arrows in FIG. 5 depict current flow. In embodiments, the N-type GaN layer 530 has a thickness of less than 0.3 µm.

Figure 6A:
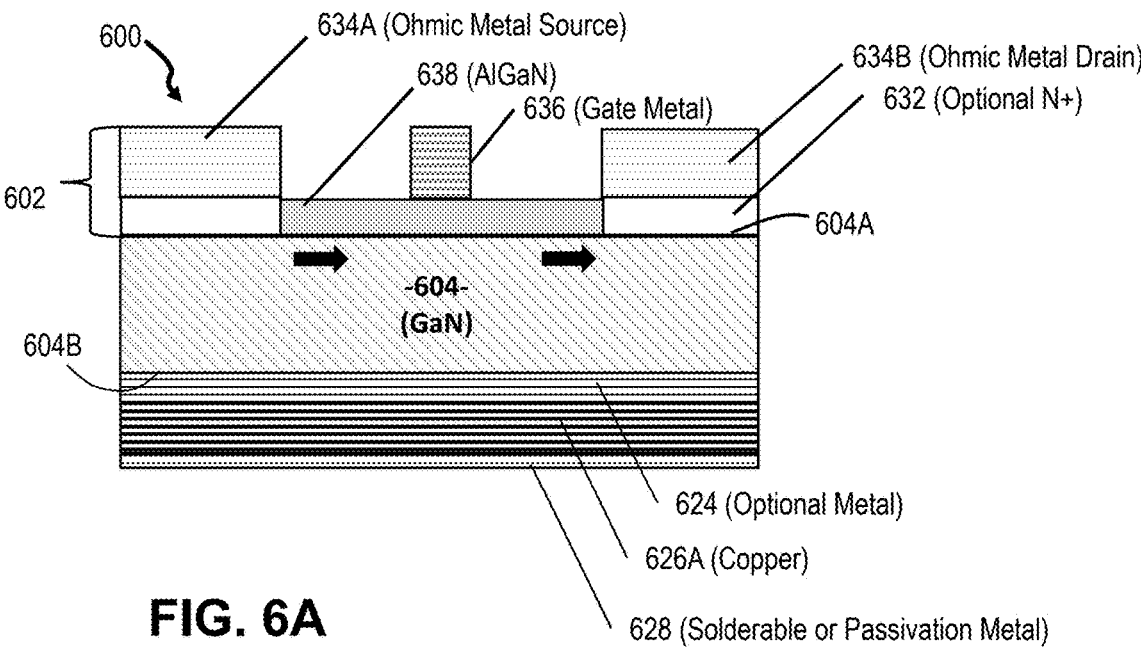
FIG. 6A is a side view of a second exemplary GaN device made in accordance with embodiments of the invention.

FIG. 6A is a side view of a second exemplary GaN device 600 made in accordance with embodiments of the invention. The GaN device 600 is manufactured in the same manner as the GaN device 500, but without the copper conductor 526B. Thus, the GaN device 600 includes a GaN material layer 604 including a number of device elements formed on a first (top) surface 604A thereof, which are generally indicated at 602. The device elements 602 include: an ohmic metal source 634A; an ohmic metal drain 634B; optionally, respective N+ material layers 632A and 632B between the ohmic metal source 634A and metal drain 634B and the GaN material layer 604; an AlGaN layer 638 above the GaN material layer 604 and positioned between the ohmic metal source 634 and the ohmic metal drain 634B; and a gate metal 636 on the AlGaN layer 638.

A copper layer 626A is deposited on a second (bottom) surface 504B of the GaN material layer 504, either directly, or by a metal layer 624 in accordance with embodiments of the invention. In implementations, the copper layer 626A acts as a mechanical support and means for thermal conductivity. A solderable metal layer or passivation metal layer 628 is deposited on a bottom surface of the copper layer 626A. In implementations, the solderable or passivation metal layer 628 may act as a barrier layer to reduce oxidation of the bottom surface of the copper layer 626A and aid in copper-copper thermal compression bonding. The solderable or passivation metal layer 628 may comprise Au, NiCu, Pd, Ti, or Sn, for example. The addition of the copper layer 626A and the solderable or passivation metal layer 628 may be performed at the wafer-level manufacturing stage or as a back-end stage (e.g., after singulation of GaN device die from the original GaN engineered wafer). As in FIG. 5, the arrows in FIG. 6A indicate current flow.

With reference to FIGS. 5 and 6A, in implementations, the thickness of the GaN material layers (504, 604) is less than 50 microns (µm). In embodiment, the GaN material layers (504, 604) are between 0.3 µm and 50 µm. In accordance with implementations described above, the GaN devices (500, 600) may be manufactured without any grinding or thinning of the GaN material layers (504, 604) in order to avoid the damage and stress associated with such processes. In embodiments, the GaN devices (500, 600) have a GaN material layer (504, 604) with an ultra-smooth second (bottom) surface (504B, 604B) with a surface roughness less than 1.0 RMS or less than 0.5 nm RMS. In implementations, the GaN devices (500, 600) have a threading edge dislocation density less than $1 \times 10^8$ dislocations/cm$^2$ and an in-plane biaxial tensile stress less than 1.5 GPa.

Figure 6B:
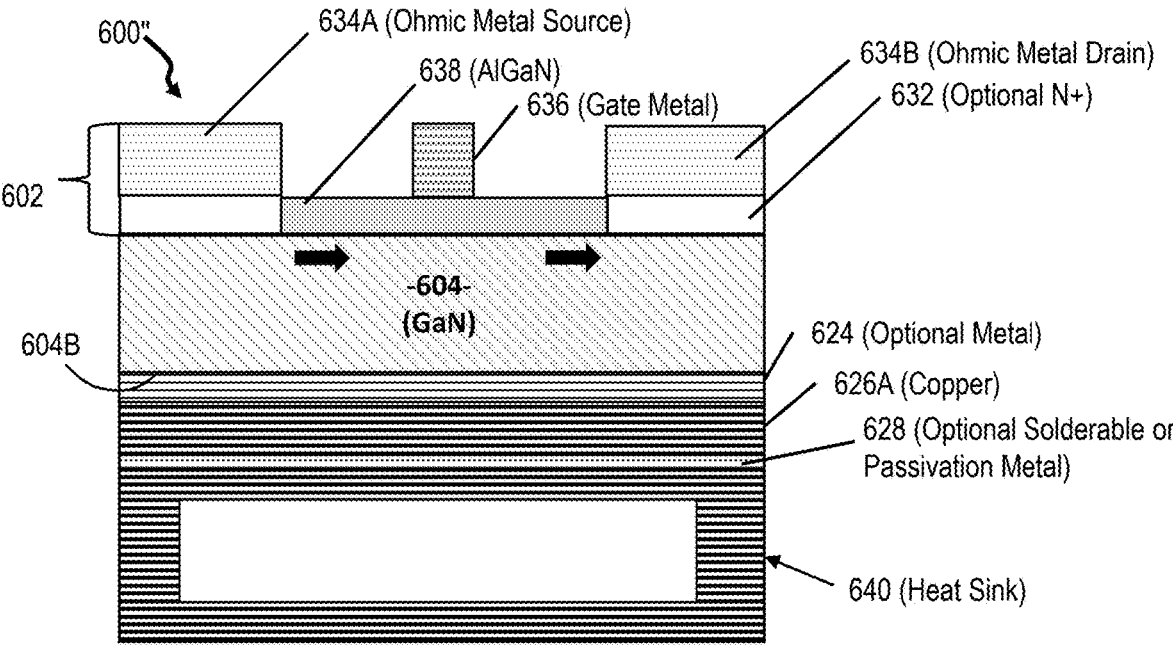
FIG. 6B is a side view of a third exemplary GaN device made in accordance with embodiments of the invention.

FIG. 6B is a side view of a third exemplary GaN device 600' made in accordance with embodiments of the invention. In the example of FIG. 6B, the GaN device 600' comprises the GaN device 600 of FIG. 6A with the addition of a heat sink 640. The heat sink 640 may be a copper heat sink as shown, or another type of heat sink. While a solderable or passivation metal layer 628 is shown between the copper layer 626A and the heat sink 640, some embodiments may forgo the solderable or passivation metal layer 628 in lieu of a copper-to-copper bond between the copper layer 626A and the heat sink 640. The heat sink 640 may utilize liquid convective flow, liquid jet flow, or forced air cooling. In implementations, the heat sink 640 is a copper/ceramic heat sink comprises a copper layer directly bonded to the copper layer 626A, with a ceramic insulator. In embodiments, the copper/ceramic heat sink includes a copper-clad molybdenum flange (not shown).

Figure 6C:
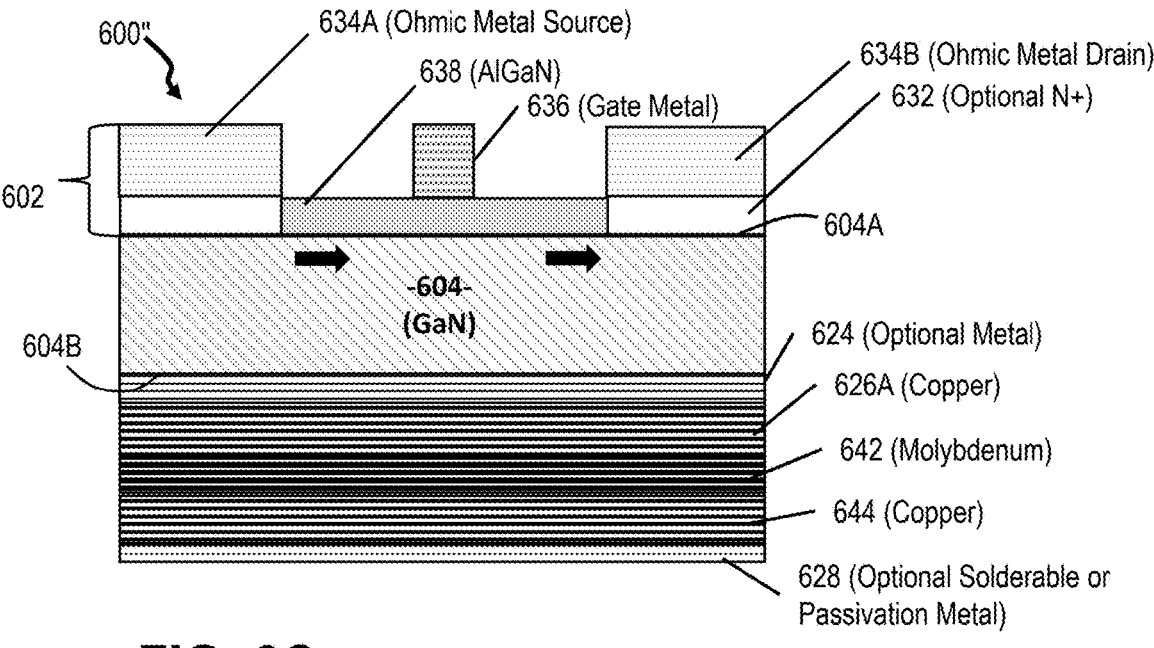
FIG. 6C is a side view of a fourth exemplary GaN device made in accordance with embodiments of the invention.

FIG. 6C is a side view of a fourth exemplary GaN device 600" made in accordance with embodiments of the invention. In the example of FIG. 6C, the GaN device 600″ comprises the GaN device 600 of FIG. 6A with the addition of a molybdenum layer 642 and a second copper layer 644 between the first copper layer 626A and the optional solderable or passivation metal layer 628.

Figure 7:
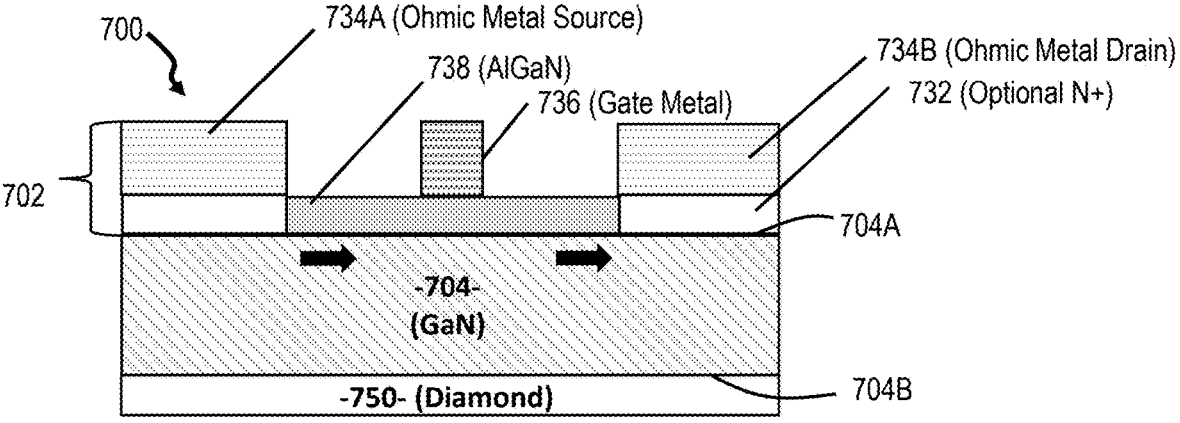
FIG. 7 is a side view of a fifth exemplary GaN device made in accordance with embodiments of the invention.

FIG. 7 is a side view of a fifth exemplary GaN device 700 made in accordance with embodiments of the invention. The GaN device 700 comprises a GaN material layer 704 including a number of device elements formed on a first (top) surface 704A thereof, which are generally indicated at 702. The device elements 702 include: an ohmic metal source 734A; an ohmic metal drain 734B; optionally, respective N+ material layers 732A and 732B between the ohmic metal source 734A and metal drain 734B and the GaN material layer 704; an AlGaN layer 738 above the GaN material layer 704 and positioned between the ohmic metal source 734 and the ohmic metal drain 734B; and a gate metal 736 on the AlGaN layer 738.

In implementations, the thickness of the GaN material layer 704 is less than 50 μm. In embodiment, the thickness of the GaN material 704 is between 0.3 μm and 50 μm. In accordance with implementations described above, the GaN device 704 may be manufactured without any grinding or thinning of the GaN material layer 704 in order to avoid the damage and stress associated with such processes. In embodiments, the GaN device 700 has a GaN material layer 704 with an ultra-smooth second (bottom) surface 704B, achieved by removing intermediate layers using chemical mechanical polishing during wafer-stage manufacturing in accordance with embodiments of the invention. In one example, the second (bottom) side 704B of the GaN material layer 704 has surface roughness less than 1.0 nm RMS or less than 0.5 nm RMS, and is either bonded directly to a diamond layer 750, or is bonded to the diamond layer 750 via an intermediate layer (not shown). As in FIG. 5, the arrows in FIG. 7 indicate current flow.

Figure 8:
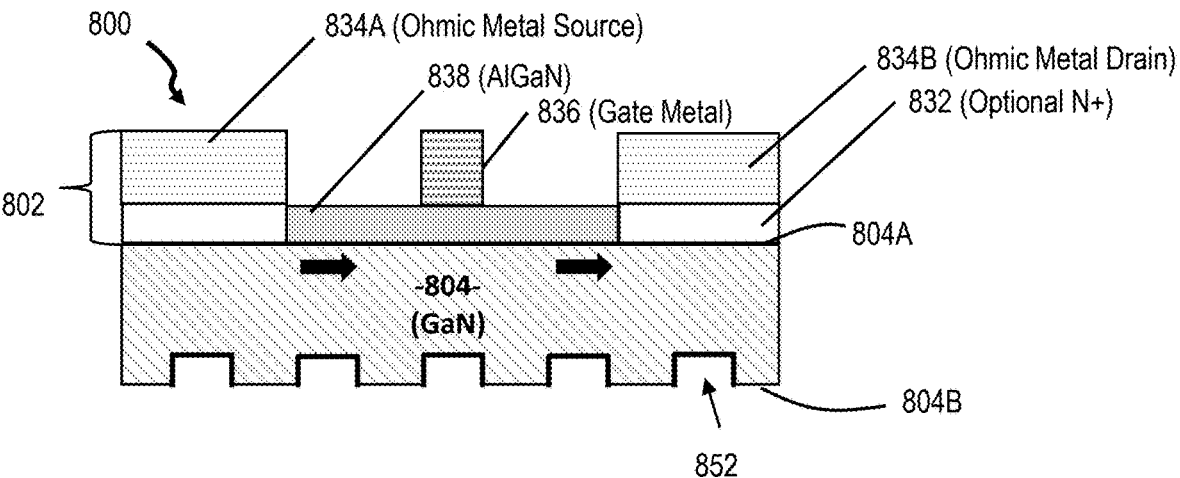
FIG. 8 is a side view of a sixth exemplary GaN device made in accordance with embodiments of the invention.

FIG. 8 is a side view of a sixth exemplary GaN device 800 made in accordance with embodiments of the invention. The GaN device 800 comprises a GaN material layer 804 including a number of device elements formed on a first (top) surface 804A thereof, which are generally indicated at 802. The device elements 802 include: an ohmic metal source 834A; an ohmic metal drain 834B; optionally, respective N+ material layers 832A and 832B between the respective ohmic metal source 734A and metal drain 734B and the GaN material layer 704; an AlGaN layer 838 above the GaN material layer 804 and positioned between the ohmic metal source 834 and the ohmic metal drain 834B; and a gate metal 836 on the AlGaN layer 838. Channels 852 are etched into the second (bottom) side 804B of the GaN material layer 804, and enable improved thermal heat transmission to a liquid. As in FIG. 5, the arrows in FIG. 8 indicate current flow.

In implementations, the greatest thickness of the GaN material layer 804 is less than 50 μm. In embodiment, the greatest thickness of the GaN material 804 is between 0.3 μm and 50 μm. In accordance with implementations described above, the GaN device 804 may be manufactured without any grinding or thinning of the GaN material layer 804 in order to avoid the damage and stress associated with such processes. In embodiments, the GaN device 800 has a GaN material layer 804 with an ultra-smooth second (bottom) surface 804B. In one example, the second (bottom) side 804B of the GaN material layer 804 has surface roughness less than 0.5 nm RMS.

Figure 9:
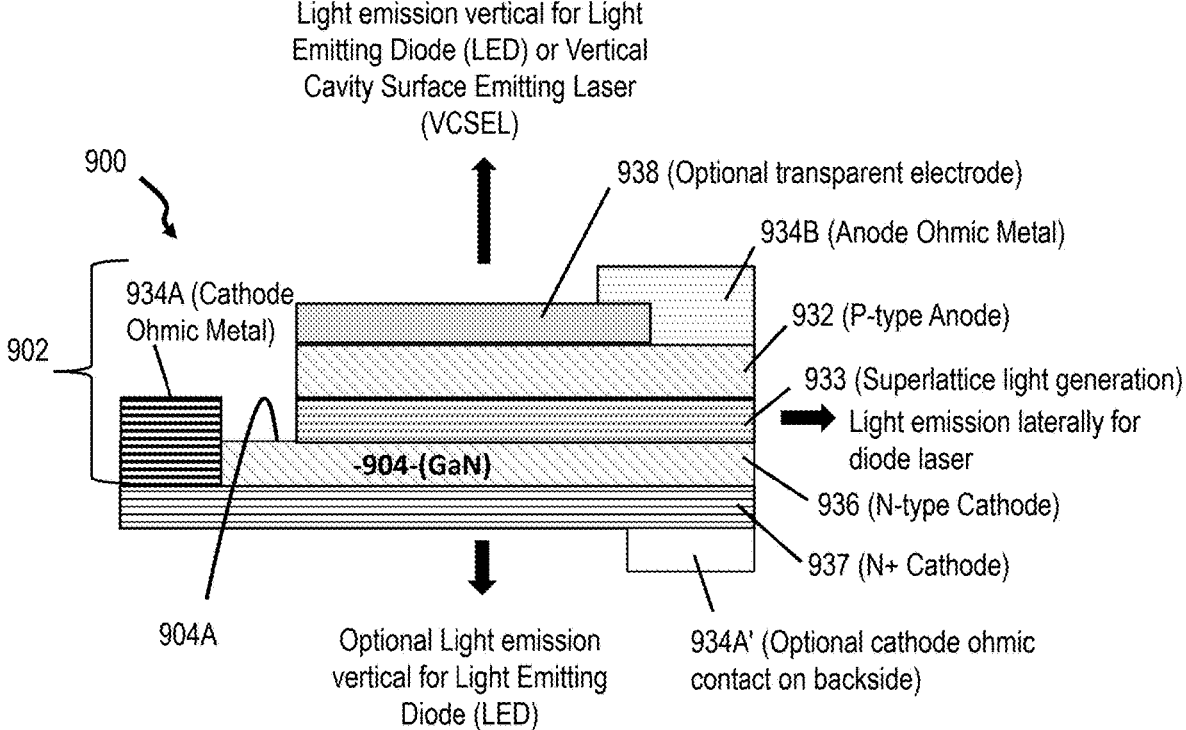
FIG. 9 is a side view of an exemplary light emitting GaN device made in accordance with embodiments of the invention.

FIG. 9 is a side view of an exemplary light emitting GaN device 900 made in accordance with embodiments of the invention. The GaN device 900 comprises a GaN material layer 904 including a number of device elements formed on a first (top) surface 904A thereof, which are generally indicated at 902. The GaN device 900 further includes an N+ Anode 937 on a second side 904A of the GaN material layer 904. The device elements 902 include: an ohmic metal cathode 934A, an ohmic metal anode 934B, a P-type anode 932, a superlattice light generation region 933, and optionally, a transparent conductive electrode 938. The transparent conductive electrode can be a conductive metal oxide, semi-transparent metal, graphene, or diamond and other materials known to the skilled artisan. The transparent conductive metal oxide can be a p-type metal oxide and comprise metal oxide materials such as indium thin oxide, zinc oxide, indium oxide tin oxide or titanium oxide and other materials known to the skilled artisan. Optionally, the GaN device 900 includes an ohmic cathode contact 934A' on a backside of the GaN device 900. In the example shown, the ohmic cathode contact 934A' is mounted to a bottom side of the N+ Anode 937. In implementations, the GaN material layer 904 acts as an N-type cathode as indicated at 936.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Exemplary Wafer-Level Methods

Some exemplary methods in accordance with embodiments discussed herein include the following. A first wafer-scale method of making a gallium nitride (GaN) device die includes: providing a GaN device die including a first layer of a GaN material, a second layer of an aluminum nitride nucleation layer, a third layer of silicon, a fourth layer of hydrofluoric acid (HF) etchable material; and a fifth layer of non-crystalize substrate; forming trenches (e.g., by etching, sawing, or laser cutting) through the first layer (top side) of the GaN material, through the second layer comprising an aluminum nitride nucleation layer, and through a third silicon layer to expose the fourth layer of HF etchable material; forming HF resistant tethers (e.g., a photoresist or aluminum) and a protective layer on the first layer (top side) GaN device die using photolithography; etching the fourth layer of HF etchable material in HF; etching the third layer of silicon using xenon fluoride vapor; etching the second layer of aluminum nitride nucleation layer (e.g., using AZ400K or KOH); attaching a UV releasable tape to a first surface (front surface) of the GaN device die to support the GaN device die formed in GaN material; attaching a carrier wafer with a heat releasable tape or heat releasable polymer on the second surface to the first surface of the UV releasable tape; and releasing the GaN device die from the non-crystalline substrate to produce a GaN device die without grind damage in the GaN material.

In implementations, the above-identified first method also includes removing the HF resistant tethers by a chemical or plasma removal process. In embodiments, the method includes depositing metal on the second surface of the GaN device die and laser cutting through the metal to singulate the GaN device die with GaN device die attached to the carrier wafer. The method may further include: performing a backside process on the GaN device selected from the group consisting of: chemically or plasma etch photoresist tethers, photolithography, metal deposition, chemical mechanical polish to reduce surface roughness to less than 0.5 nm root mean square, chemical mechanical polish to remove silicon layer and aluminum nitride nucleation layer, depositing a metal seed layer for electroplating, electroplate metal, plasma etching, laser anneal, depositing metal and laser cut through metal to singulate die, and depositing metal and electrodischarge machining through the metal to singulate die. In implementations, the method includes depositing a seed metal, perform photolithography to pattern the photoresist, and electroplate metal on a back side of the GaN die. In embodiments, the method includes releasing the GaN device die from the carrier wafer (e.g., by heating heat releasable tape or laser illumination); attaching tape to a second surface (backside surface) of the GaN material; releasing the UV releasable tape (e.g., by UV illumination); and removing the protective layer by etching to produce a GaN device die without grind damage in the GaN material and a GaN device die with second surface attached a tape.

In aspects of the invention, the GaN device die has a GaN substrate thickness from 300 nm to 100 microns. The method may also include forming one or more metal layers on a second surface of the GaN device die. The one or more metal layers may comprise a metal and at least one conductive mechanical support metal (e.g., copper). The at least one conductive mechanical support metal may comprise a multi-layer structure of copper and molybdenum. The one or more metal layers may comprise a barrier layer metal on the second surface configured to reduce oxidation of the second surface of a metal layer. In implementations, the GaN material comprises GaN material doped with carbon or iron dopants. In embodiments, the GaN die device has a GaN material second surface with a surface roughness less than 0.5 nm Root Mean Square (RMS).

A second method in accordance with embodiments of the invention includes: providing a GaN die including a first layer of GaN substrate; a second layer comprising an aluminum nitride nucleation layer; a third layer of silicon, a third layer of hydrofluoric acid (HF) etchable material and a fifth layer of a non-crystalline substrate; forming trenches (e.g., by etching, sawing, or laser cutting) through the first layer (top side) of the GaN material, through the second layer comprising an aluminum nitride nucleation layer, and through a third silicon layer to expose the fourth layer of HF etchable material; forming tethers (e.g., a photoresist or aluminum) and a protective layer comprising aluminum on the first surface (top side) of GaN device die formed in GaN material using photolithography; etching the fourth layer of HF etchable material in HF; optionally etching the third layer of silicon using xenon fluoride vapor; optionally etching the second layer of aluminum nitride nucleation layer (e.g., using AZ400K or KOH); forming a second tether on the GaN device die using photolithography; chemically etching the aluminum; attaching a UV releasable tape to a first surface (front surface) of the GaN device die; attaching a carrier wafer with a heat releasable tape or heat releasable polymer on the second surface to the first surface of the UV releasable tape; and releasing the GaN device die from the non-crystalline substrate to produce a GaN device die without grind damage in the GaN material and available for further processing the GaN device die second surface.

In some embodiments, the second method further includes: performing a backside process on the GaN device selected from the group consisting of: chemically or plasma etch photoresist tethers, photolithography, metal deposition, chemical mechanical polish to reduce surface roughness to less than 0.5 nm root mean square, chemical mechanical polish to remove silicon layer and aluminum nitride nucleation layer, depositing a metal seed layer for electroplating, electroplate metal, plasma etching, laser anneal, depositing metal and laser cut through metal to singulate die, and depositing metal and electrodischarge machining through the metal to singulate die. The method may include: releasing the GaN device die from the carrier wafer (e.g., by heating heat releasable tape or laser illumination); attaching tape to a second surface (backside surface) of the GaN material; releasing the UV releasable tape (e.g., by UV illumination); and optionally etching photoresist to produce a GaN device die without grind damage in the GaN material and a GaN device die with second surface attached a tape.

In implementations the second method includes transferring the GaN device die formed in GaN material from a first surface attached to a tape or polymer to a second surface attached to a tape or polymer. In embodiments, the second method includes removing (e.g., via etching) a polymer or photoresist layer on the top side of the GaN device die.

A third wafer-scale method of making a gallium nitride (GaN) device die comprises: providing a carrier wafer including a first layer for laser release (laser release layer) and a second heat releasable layer (e.g., polymer); providing a GaN device die including a GaN material tethered to a non-crystalline substrate by removable tethers; attaching a UV releasable tape to a first surface (top surface) of the GaN device die; attaching the carrier wafer to a first surface of the UV releasable tape; releasing the GaN device die formed in GaN material from the non-crystalline substrate; polishing and thinning to remove material on the second surface of the GaN material and a portion of the GaN; depositing metal on the second surface of the GaN device die and laser cutting through the metal to singulate the GaN device die; attaching tape to a second surface (bottom surface) of the GaN device die; releasing the GaN device die from the carrier wafer (e.g., by heating heat releasable tape or laser illumination of a laser release layer); and releasing the UV releasable tape (e.g., by UV illumination) to produce a GaN device die without grind damage in the GaN material. In embodiments, the third method also includes removing the tethers. The third method may also include depositing a layer of metal on the GaN material. Implementations of the third method, include: performing a backside process on the GaN device selected from the group consisting of: chemically or plasma etch photoresist tethers, photolithography, metal deposition, chemical mechanical polish to reduce surface roughness to less than 0.5 nm root mean square, chemical mechanical polish to remove silicon layer and aluminum nitride nucleation layer, depositing a metal seed layer for electroplating, electroplate metal, plasma etching, laser anneal, depositing metal and laser cut through metal to singulate die, and depositing metal and electrodischarge machining through the metal to singulate die. In aspects, the third method includes transferring the GaN device die from a first surface attached to a tape or polymer to a second surface attached to a tape or polymer.

In embodiments, a fourth method of making a gallium nitride (GaN) device die includes: providing a GaN device die including a first layer of a GaN material, a second layer comprising an aluminum nitride nucleation layer, a third layer of silicon, a fourth layer of hydrofluoric acid (HF) etchable material; and a fifth layer of non-crystalize substrate; attaching a UV releasable tape to a front surface of the GaN substrate to support the GaN substrate; attaching a carrier wafer with a heat releasable tape or heat releasable polymer on the second surface to the first surface of the UV releasable tape; releasing the GaN substrate from the carrier wafer (e.g., by heating heat releasable tape or laser illumination of a laser release layer); attaching tape to a backside surface of the GaN die; releasing the UV releasable tape (e.g., by UV illumination) to produce a GaN device die without grind damage in the GaN material and a GaN device die with second surface attached a tape. In implementations, the method further includes forming trenches (e.g., by etching sawing or laser cutting) in the first layer (top side) of the GaN die to expose the fourth layer of HF etchable material. In aspects, the method further includes: performing a backside process on the GaN device selected from the group consisting of: chemically or plasma etch photoresist tethers, photolithography, metal deposition, chemical mechanical polish to reduce surface roughness to less than 0.5 nm root mean square, chemical mechanical polish to remove silicon layer and aluminum nitride nucleation layer, depositing a metal seed layer for electroplating, electroplate metal, plasma etching, laser anneal, depositing metal and laser cut through metal to singulate die, and depositing metal and electrodischarge machining through the metal to singulate die. Some implementations of the third method include depositing metal on the second surface of the GaN material and laser cutting the GaN die to singulate the GaN die. The method may further include depositing a seed metal layer, performing photolithography to pattern a photoresist layer, and electroplate metal layer on a backside of the GaN die. The method may also comprise etching the metal in kerf lanes and/or transferring the GaN device die from a first surface attached to a tape or polymer to a second surface attached to a tape or polymer.

In embodiments, a GaN device (optionally made by one of the above methods) includes: a GaN substrate including a top surface and a bottom surface, the top surface having one or more devices formed thereon and a bottom surface opposite the top surface comprising a GaN material free from grind damage. In implementations, the outer surface of the GaN device has a surface roughness less than 0.5 nm Root Mean Square (RMS).

Exemplary Devices Produced by Wafer-Level Methods

In accordance with embodiments of the invention, methods discussed herein may result in GaN devices or GaN device die (e.g., FIGS. 5, 6A-6C, 7 and 8). For example, a first exemplary GaN device comprises: a GaN substrate, a plurality of device elements mounted on a first side of the GaN substrate, and a copper layer mounted to a second side of the GaN substrate by a process that uses an adhesion metal, a seed metal, and copper plating or by an adhesion metal and a copper deposited metal. In implementations, the first exemplary GaN device includes a copper element mounted to the first side of the GaN substrate, wherein the copper element and the copper layer comprise a microstrip transmission line. The portion of GaN material between the copper element on the GaN first side and the copper layer on the GaN second side may be doped with iron or carbon to make the GaN material semi-insulating with a resistivity greater than $1 \times 10^4$ ohm-cm or insulating with a resistivity more than $1 \times 10^7$ ohm-cm. The portion of the GaN material between the copper element and the copper layer may have a thickness in the range of 2 micron to 100 micron. The width of the copper element is selected to enable a selected resistance for the microwave transmission line, such as 50 ohms or 75 ohms, for example. The thickness of the copper element and the copper layer are selected to be thicker than the skin depth of the microwave field within the copper. The surface roughness of the copper element can be less than 100 nm to minimize the microstrip transmission line microwave loss. The thickness of the copper layer can be selected to be larger than the microwave skin depth and also sufficiently thick to provide mechanical support to the thin GaN device die to prevent cracking of the GaN device die. The copper layer can be selected to have a thickness in the range of 0.5 microns to 50 microns.

In embodiments, the device elements includes an ohmic metal source, an ohmic metal drain, an N-type GaN layer, an AlGaN layer between the ohmic metal source and the ohmic metal drain, and a gate metal on the AlGaN layer. Respective N+ material layers may be located between the respective ohmic metal source and ohmic metal drain, and the N-type GaN layer. The device elements may be formed in a GaN material mesa structure above on top of semi-insulating or insulating GaN material. The mesa GaN material and the semi-insulating or insulating GaN material are non-grind damaged GaN material. In embodiments, an optional heat sink may be mounted to the copper layer (e.g., by an optional solderable or passivation metal). Optionally, a second copper layer is mounted to the first copper layer via a molybdenum layer to reduce the thermal expansion mismatch between the combination of the copper and molybdenum layers and the GaN material.

A GaN device die bonded to a diamond substrate (e.g., the exemplary device of FIG. 7) includes a diamond substrate with GaN device die elements mounted to a first side thereof. In implementations, a diamond substrate is mounted or direct fusion bonded to a second side of the GaN device die thereof. The diamond substrate can be polycrystalline, highly oriented polycrystalline, single crystalline, heteroepitaxial diamond substrate grown on iridium substrates, or diamond substrate grown on microneedles. In one embodiment, the GaN material second surface is CMP polished to a surface roughness less than 1 nm RMS. The diamond substrate first surface is polished to a surface roughness less than 1 RMS. A silicon layer less than 1 nm may be optionally deposited on the GaN surface or the diamond surface. The surfaces of the GaN and diamond may be treated to generate hydroxyl molecule (OH—) bonds of the GaN or diamond surfaces. In addition, the GaN and diamond surfaces may be plasma activated or surface activated using an ion beam followed by direct fusion bond of the GaN material surface and the diamond surface An exemplary light emitting GaN device is a light emitting diode, vertical cavity surface emitting laser, or lateral emitting diode laser (see FIG. 9, for example). For example, a light emitting GaN device comprises: a GaN substrate, a plurality of device elements mounted on a first side of the GaN substrate, and a N+ doped GaN layer near or at the second surface of the GaN layer that acts as a cathode of a PN diode light emitting diode or laser, and photolithography defined P+ anode on the first surface that acts as an anode of a light emitting diode or laser, and comprises a III-nitride superlattice layer within the region between the P+ anode and P+ cathode. The light emitting diodes can be microlight emitting diodes. The light emitting diodes can be front surface light emitting diodes. The light emitting diode can optically be a backsurface light emitting diode. Laterally emitting lasers would have partially transparent mirror and also reflective mirrors formed on the light emitting side surfaces of the GaN material. The cathode ohmic contract can be formed on the front surface (first surface) of the GaN material or formed on the back surface (second surface) of the GaN material. For the front surface cathode ohmic contact, the GaN material layer is etched in a mesa structure to the N+ III-nitride material and the GaN ohmic metal deposited on the surface of the etched region. The cathode ohmic contact can optionally be formed on the second surface of the GaN material. An advantage of forming the ohmic contact on the backsurface of the GaN material is that the cathode resistance is significantly reduced for a backside contact then for a front side lateral cathode ohmic contact that would have the added series resistance of the lateral N+ cathode material. An optional transparent conductive electrode can be formed on the first surface of the GaN material for front side emitting light emitting diodes or front side emitting vertical cavity surface emitting lasers. The transparent conductive electrode can be a conductive metal oxide, semi-transparent metal, graphene, or diamond and other materials known to the skilled artisan. The transparent conductive metal oxide can be a p-type metal oxide and comprise metal oxide materials such as indium thin oxide, zinc oxide, indium oxide tin oxide or titanium oxide and other materials known to the skilled artisan. A polymer microlens can be optionally formed on the front or back surfaces.

In other implementations, multiple channels are cut into the second side of the GaN device to provide improved thermal transfer with fluids.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. The term "and/or" includes any and all combinations of one or more of the associated listed items.

Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

It will be understood that, although the terms first, second, etc. may be used herein to describe various elements, these elements should not be limited by these terms. These terms are only used to distinguish one element from another element. Thus, a first element discussed herein could be termed a second element without departing from the scope of the present inventive concepts.

It will also be understood that when an element is referred to as being "on", "connected" to/with, or "coupled" to/with another element, it can be directly on, connected to/with, or coupled to/with the other element, or intervening elements may be present. In contrast, when an element is referred to as being "directly on", "directly connected" to/with, or "directly coupled" to/with another element, there are no intervening elements present. Similarly, when an operation/ element is referred to as being "responsive to" or "in response to" another event/operation/element, it can be directly responsive to or directly in response to the other operation/element or intervening events/operations/elements may be present. In contrast, when an operation/element is referred to as being "directly responsive to" or "directly in response to" another event/operation/element, there are no intervening events/operations/elements present. Moreover, if an element is referred to as being "on" another element, no spatial orientation is implied such that the element can be over the other element, under the other element, on a side of the other element, etc.

What is claimed is:

1. A wafer-scale method of making a gallium nitride (GaN) device die comprising:
   providing a GaN wafer including a GaN material layer, a non-crystalline substrate, and at least one etchable intermediate layer between the GaN material layer and the non-crystalline substrate, wherein the at least one etchable intermediate layer comprises a nucleation layer, a silicon material layer, and an etchable material layer;
   forming trenches through the GaN material layer and at least partially through the at least one etchable intermediate layer;
   forming one or more tether material layers on a first side of the GaN material layer and through portions of the trenches, thereby forming a set of tethers between the GaN material layer and the non-crystalline substrate; and
   removing the at least one etchable intermediate layer to expose a second side of the GaN material layer.

2. The method of claim 1, further comprising depositing at least one additional layer directly on the second side of the GaN material layer.

3. The method of claim 2, wherein the at least one additional layer is directly deposited on the second side of the GaN material layer without any physical grinding of the GaN material layer.

4. The method of claim 1, wherein removing the at least one etchable intermediate layer comprises removing the nucleation layer and the silicon material layer via etching.

5. The method of claim 1, wherein the etchable material layer is a hydrofluoric acid etchable material layer, the one or more tether material layers are resistant to hydrofluoric acid, and removing the hydrofluoric acid etchable material layer comprises etching with hydrofluoric acid.

6. The method of claim 1, wherein the etchable material layer is an anhydrous hydrofluoric vapor etchable material, the tether material layer is resistant to anhydrous hydrofluoric vapor, and removing the anhydrous hydrofluoric acid etchable material layer comprises etching with anhydrous hydrofluoric vapor.

7. The method of claim 6, further comprising removing at least a portion of the one or more tether material layers via etching.

8. The method of claim 1, further comprising depositing a protective layer over at least a portion of a top of the GaN wafer, wherein the protective layer protects against hydrofluoric acid etching, hydrofluoric acid plus oleum etching, or anhydrous hydrofluoric vapor etching.

9. The method of claim 1, wherein the GaN material layer comprises one or more device elements in contact therewith.

10. The method of claim 1, wherein the one or more tether material layers comprises a first tether material layer defining a first set of tethers between the GaN material layer and the non-crystalline substrate and a photoresist layer forming a second set of tethers between the GaN material layer and the non-crystalline substrate.

11. The method of claim 1, further comprising attaching, by a releasable adhesive material, a wafer-scale carrier wafer package to the GaN wafer.

12. The method of claim 11, wherein the releasable adhesive material is selected from the group consisting of: a heat-releasable adhesive, an ultra-violet releasable adhesive, a laser releasable adhesive, an organic releasable adhesive, an inorganic releasable adhesive, a laser release layer adhesive, and combinations thereof.

13. The method of claim 11, wherein the carrier wafer package includes a carrier wafer and a second releasable adhesive material, and wherein the releasable adhesive material attaches the carrier wafer to the GaN wafer through the second releasable adhesive material.

14. The method of claim 11, further comprising, breaking or removing a portion of the set of tethers from the GaN wafer to separate the non-crystalline substrate from the GaN material layer.

15. A wafer-scale method of making a gallium nitride (GaN) device die comprising:

providing a GaN wafer including a GaN material layer, a non-crystalline substrate, and at least one etchable intermediate layer between the GaN material layer and the non-crystalline substrate;

forming trenches through the GaN material layer and at least partially through the at least one etchable intermediate layer;

forming one or more tether material layers on a first side of the GaN material layer and through portions of the trenches, thereby forming a set of tethers between the GaN material layer and the non-crystalline substrate;

removing the at least one etchable intermediate layer to expose a second side of the GaN material layer; and chemical mechanical polishing the second side of the GaN material layer, resulting in the second side of the GaN material layer having a surface roughness of less than 1 nanometers (nm) Root Mean Square (RMS).

16. A wafer-scale method of making a gallium nitride (GaN) device die comprising:

providing a GaN wafer including a GaN material layer, a non-crystalline substrate, and at least one etchable intermediate layer between the GaN material layer and the non-crystalline substrate;

forming trenches through the GaN material layer and at least partially through the at least one etchable intermediate layer;

forming one or more tether material layers on a first side of the GaN material layer and through portions of the trenches, thereby forming a set of tethers between the GaN material layer and the non-crystalline substrate;

removing the at least one etchable intermediate layer to expose a second side of the GaN material layer; and attaching, by a releasable adhesive material, a wafer-scale carrier wafer package to the GaN wafer;

wherein the carrier wafer package includes a carrier wafer and a second releasable adhesive material, and wherein the releasable adhesive material attaches the carrier wafer to the GaN wafer through the second releasable adhesive material; and wherein the carrier wafer package further includes a laser release layer between the carrier wafer and the second releasable adhesive material, and the carrier wafer is transparent to laser light.

17. A wafer-scale method of making a gallium nitride (GaN) device die comprising:

providing a GaN wafer including a GaN material layer, a non-crystalline substrate, and at least one etchable intermediate layer between the GaN material layer and the non-crystalline substrate;

forming trenches through the GaN material layer and at least partially through the at least one etchable intermediate layer;

forming one or more tether material layers on a first side of the GaN material layer and through portions of the trenches, thereby forming a set of tethers between the GaN material layer and the non-crystalline substrate;

removing the at least one etchable intermediate layer to expose a second side of the GaN material layer;

attaching, by a releasable adhesive material, a wafer-scale carrier wafer package to the GaN wafer;

breaking or removing a portion of the set of tethers from the GaN wafer to separate the non-crystalline substrate from the GaN material layer;

attaching an adhesive tape to a bottom side of the GaN wafer; and removing the carrier wafer package from the GaN material layer.

18. The method of claim 14, further comprising singulating the GaN device die from the GaN wafer.

19. The method of claim 17, further comprising transferring the GaN device die using a wafer-scale transfer method or a sequential wafer-scale transfer method.

* * * * *